(12) United States Patent
Oganesian et al.

(10) Patent No.: US 9,620,437 B2
(45) Date of Patent: *Apr. 11, 2017

(54) STACKED MICROELECTRONIC ASSEMBLY WITH TSVS FORMED IN STAGES AND CARRIER ABOVE CHIP

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,295

(22) Filed: Feb. 18, 2016

(65) Prior Publication Data

US 2016/0163620 A1   Jun. 9, 2016

Related U.S. Application Data

(60) Continuation of application No. 14/224,379, filed on Mar. 25, 2014, now Pat. No. 9,269,692, which is a
(Continued)

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76802* (2013.01); *H01L 21/76877* (2013.01);
(Continued)

(58) Field of Classification Search
CPC ............ H01L 23/481; H01L 21/76802; H01L 21/76877; H01L 21/76898; H01L 21/78;
(Continued)

(56) References Cited

U.S. PATENT DOCUMENTS

| 4,074,342 A | 2/1978 | Honn et al. |
| 4,682,074 A | 7/1987 | Hoeberechts et al. |

(Continued)

FOREIGN PATENT DOCUMENTS

| CN | 1327263 A | 12/2001 |
| CN | 1490875 A | 4/2004 |

(Continued)

OTHER PUBLICATIONS

Partial International Search Report, PCT/US2008/002659.
(Continued)

*Primary Examiner* — Nicholas Tobergte
(74) *Attorney, Agent, or Firm* — Lerner, David, Littenberg, Krumholz & Mentlik, LLP

(57) ABSTRACT

A microelectronic assembly is provided which includes a first element consisting essentially of at least one of semiconductor or inorganic dielectric material having a surface facing and attached to a major surface of a microelectronic element at which a plurality of conductive pads are exposed, the microelectronic element having active semiconductor devices therein. A first opening extends from an exposed surface of the first element towards the surface attached to the microelectronic element, and a second opening extends from the first opening to a first one of the conductive pads, wherein where the first and second openings meet, interior surfaces of the first and second openings extend at different angles relative to the major surface of the microelectronic
(Continued)

element. A conductive element extends within the first and second openings and contacts the at least one conductive pad.

20 Claims, 25 Drawing Sheets

Related U.S. Application Data division of application No. 13/051,424, filed on Mar. 18, 2011, now Pat. No. 8,736,066.

(60) Provisional application No. 61/419,033, filed on Dec. 2, 2010.

(51) Int. Cl.
  *H01L 23/498* (2006.01)
  *H01L 21/78* (2006.01)
  *H01L 23/14* (2006.01)
  *H01L 23/00* (2006.01)

(52) U.S. Cl.
  CPC ........ *H01L 21/76898* (2013.01); *H01L 21/78* (2013.01); *H01L 23/49827* (2013.01); *H01L 24/16* (2013.01); *H01L 24/89* (2013.01); *H01L 24/92* (2013.01); *H01L 21/76805* (2013.01); *H01L 23/145* (2013.01); *H01L 23/147* (2013.01); *H01L 24/11* (2013.01); *H01L 24/29* (2013.01); *H01L 24/32* (2013.01); *H01L 24/81* (2013.01); *H01L 24/83* (2013.01); *H01L 2224/0401* (2013.01); *H01L 2224/0557* (2013.01); *H01L 2224/13009* (2013.01); *H01L 2224/13099* (2013.01); *H01L 2224/16225* (2013.01); *H01L 2224/16235* (2013.01); *H01L 2224/83* (2013.01); *H01L 2224/9202* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01023* (2013.01); *H01L 2924/01029* (2013.01); *H01L 2924/01033* (2013.01); *H01L 2924/01049* (2013.01); *H01L 2924/01061* (2013.01); *H01L 2924/01074* (2013.01); *H01L 2924/01082* (2013.01); *H01L 2924/12042* (2013.01); *H01L 2924/14* (2013.01); *H01L 2924/15311* (2013.01)

(58) Field of Classification Search
  CPC ... H01L 23/49827; H01L 24/16; H01L 24/89; H01L 24/92; H01L 23/145; H01L 23/147; H01L 24/11; H01L 24/29; H01L 24/32; H01L 24/81; H01L 24/83
  See application file for complete search history.

(56) References Cited

U.S. PATENT DOCUMENTS

| | | |
|---|---|---|
| 4,765,864 A | 8/1988 | Holland et al. |
| 4,941,033 A | 7/1990 | Kishida |
| 5,148,265 A | 9/1992 | Khandros et al. |
| 5,148,266 A | 9/1992 | Khandros et al. |
| 5,229,647 A | 7/1993 | Gnadinger |
| 5,322,816 A | 6/1994 | Pinter |
| 5,334,561 A | 8/1994 | Matsui et al. |
| 5,347,159 A | 9/1994 | Khandros et al. |
| 5,481,133 A | 1/1996 | Hsu |
| 5,511,428 A | 4/1996 | Goldberg et al. |
| 5,679,977 A | 10/1997 | Khandros et al. |
| 5,686,762 A | 11/1997 | Langley |
| 5,700,735 A | 12/1997 | Shiue et al. |
| 5,703,408 A | 12/1997 | Ming-Tsung et al. |
| 5,808,874 A | 9/1998 | Smith |
| 5,821,608 A | 10/1998 | DiStefano et al. |
| 5,998,861 A | 12/1999 | Hiruta |
| 6,002,161 A | 12/1999 | Yamazaki |
| 6,005,466 A | 12/1999 | Pedder |
| 6,013,948 A | 1/2000 | Akram et al. |
| 6,022,758 A | 2/2000 | Badehi |
| 6,031,274 A | 2/2000 | Muramatsu et al. |
| 6,037,668 A | 3/2000 | Cave et al. |
| 6,103,552 A | 8/2000 | Lin |
| 6,143,369 A | 11/2000 | Sugawa et al. |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,024 B1 | 11/2001 | Cave et al. |
| 6,313,540 B1 | 11/2001 | Kida et al. |
| 6,362,529 B1 | 3/2002 | Sumikawa et al. |
| 6,368,410 B1 | 4/2002 | Gorczyca et al. |
| 6,399,892 B1 | 6/2002 | Milkovich et al. |
| 6,472,247 B1 | 10/2002 | Andoh et al. |
| 6,492,201 B1 | 12/2002 | Haba |
| 6,498,381 B2 | 12/2002 | Halahan et al. |
| 6,498,387 B1 | 12/2002 | Yang |
| 6,507,113 B1 | 1/2003 | Fillion et al. |
| 6,531,384 B1 | 3/2003 | Kobayashi et al. |
| 6,555,913 B1 | 4/2003 | Sasaki et al. |
| 6,586,955 B2 | 7/2003 | Fjelstad et al. |
| 6,608,377 B2 | 8/2003 | Chang et al. |
| 6,638,352 B2 | 10/2003 | Umino et al. |
| 6,693,358 B2 | 2/2004 | Yamada et al. |
| 6,716,737 B2 | 4/2004 | Plas et al. |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,853,046 B2 | 2/2005 | Shibayama |
| 6,864,172 B2 | 3/2005 | Noma et al. |
| 6,867,123 B2 | 3/2005 | Katagiri et al. |
| 6,873,054 B2 | 3/2005 | Miyazawa et al. |
| 6,879,049 B1 | 4/2005 | Yamamoto et al. |
| 6,914,336 B2 | 7/2005 | Matsuki et al. |
| 6,927,156 B2 | 8/2005 | Mathew |
| 6,936,913 B2 | 8/2005 | Akerling et al. |
| 6,982,475 B1 | 1/2006 | MacIntyre |
| 7,026,175 B2 | 4/2006 | Li et al. |
| 7,068,139 B2 | 6/2006 | Harris et al. |
| 7,091,062 B2 | 8/2006 | Geyer |
| 7,112,874 B2 | 9/2006 | Atlas |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,807,508 B2 | 10/2010 | Oganesian et al. |
| 7,829,976 B2 | 11/2010 | Kirby et al. |
| 7,834,273 B2 | 11/2010 | Takahashi et al. |
| 7,901,989 B2 | 3/2011 | Haba et al. |
| 7,915,710 B2 | 3/2011 | Lee et al. |
| 7,935,568 B2 | 5/2011 | Oganesian et al. |
| 8,008,121 B2 | 8/2011 | Choi et al. |
| 8,008,192 B2 | 8/2011 | Sulfridge |
| 8,193,615 B2 | 6/2012 | Haba et al. |
| 8,253,244 B2 | 8/2012 | Kang |

(56) References Cited

U.S. PATENT DOCUMENTS

| | | |
|---|---|---|
| 8,263,434 B2 | 9/2012 | Pagaila et al. |
| 8,299,608 B2 | 10/2012 | Bartley et al. |
| 8,310,036 B2 | 11/2012 | Haba et al. |
| 8,405,196 B2 | 3/2013 | Haba et al. |
| 8,421,193 B2 | 4/2013 | Huang |
| 8,421,238 B2 | 4/2013 | Inagaki |
| 8,685,793 B2 | 4/2014 | Oganesian et al. |
| 2001/0028098 A1 | 10/2001 | Liou |
| 2001/0048591 A1 | 12/2001 | Fjelstad et al. |
| 2002/0030245 A1 | 3/2002 | Hanaoka et al. |
| 2002/0048668 A1 | 4/2002 | Inoue |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0127839 A1 | 9/2002 | Umetsu et al. |
| 2002/0151171 A1 | 10/2002 | Furusawa |
| 2003/0047351 A1 | 3/2003 | Satsu et al. |
| 2003/0049193 A1 | 3/2003 | Satsu et al. |
| 2003/0059976 A1 | 3/2003 | Nathan et al. |
| 2003/0071331 A1 | 4/2003 | Yamaguchi et al. |
| 2003/0137056 A1 | 7/2003 | Taniguchi et al. |
| 2003/0178714 A1 | 9/2003 | Sakoda et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0121606 A1 | 6/2004 | Raskin et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0203224 A1 | 10/2004 | Halahan et al. |
| 2004/0217483 A1 | 11/2004 | Hedler et al. |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0148250 A1 | 7/2006 | Kirby |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0061436 A1 | 3/2008 | Yang et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0008747 A1 | 1/2009 | Hoshino et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0108464 A1 | 4/2009 | Uchiyama |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0166846 A1 | 7/2009 | Pratt et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0047963 A1 | 2/2010 | Wang et al. |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0140775 A1 | 6/2010 | Jung |
| 2010/0148371 A1 | 6/2010 | Kaskoun et al. |
| 2010/0155940 A1 | 6/2010 | Kawashita et al. |
| 2010/0159643 A1 | 6/2010 | Takahashi et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1* | 9/2010 | Kriman ............... H01L 23/481 |
| | | 257/686 |
| 2010/0258917 A1 | 10/2010 | Lin |
| 2011/0089573 A1 | 4/2011 | Kurita |
| 2011/0095373 A1 | 4/2011 | Hwang et al. |
| 2011/0195546 A1 | 8/2011 | Yang |
| 2011/0204505 A1 | 8/2011 | Pagaila et al. |
| 2011/0221070 A1 | 9/2011 | Yen et al. |
| 2011/0266674 A1 | 11/2011 | Hsia et al. |

(56) References Cited

U.S. PATENT DOCUMENTS

| | | |
|---|---|---|
| 2011/0304057 A1 | 12/2011 | Matsumoto |
| 2012/0007232 A1 | 1/2012 | Haba |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0020026 A1 | 1/2012 | Oganesian et al. |
| 2012/0025365 A1 | 2/2012 | Haba |
| 2012/0068330 A1 | 3/2012 | Oganesian et al. |
| 2012/0068351 A1 | 3/2012 | Oganesian et al. |
| 2012/0068352 A1 | 3/2012 | Oganesian et al. |
| 2012/0139094 A1 | 6/2012 | Haba et al. |

FOREIGN PATENT DOCUMENTS

| | | |
|---|---|---|
| CN | 1758430 A | 4/2006 |
| CN | 101350322 A | 1/2009 |
| CN | 101675516 A | 3/2010 |
| CN | 201910420 U | 7/2011 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | H07505982 A | 6/1995 |
| JP | 08-213427 A | 8/1996 |
| JP | 11016949 A | 1/1999 |
| JP | 11195706 A | 7/1999 |
| JP | 2000299408 A | 10/2000 |
| JP | 2001-085559 A | 3/2001 |
| JP | 2001-217386 A | 8/2001 |
| JP | 2002016178 A | 1/2002 |
| JP | 2002050738 A | 2/2002 |
| JP | 03285338 B2 | 5/2002 |
| JP | 2002162212 A | 6/2002 |
| JP | 2002-217331 A | 8/2002 |
| JP | 2002270718 A | 9/2002 |
| JP | 2002373957 A | 12/2002 |
| JP | 2003020404 A | 1/2003 |
| JP | 2003198069 A | 7/2003 |
| JP | 2003318178 A | 11/2003 |
| JP | 2004014657 A | 1/2004 |
| JP | 2004158537 | 6/2004 |
| JP | 2004165602 A | 6/2004 |
| JP | 2004-200547 A | 7/2004 |
| JP | 2005-026405 A | 1/2005 |
| JP | 2005031117 A | 2/2005 |
| JP | 2005-093486 A | 4/2005 |
| JP | 2005-101268 A | 4/2005 |
| JP | 2005522019 A | 7/2005 |
| JP | 2005209967 A | 8/2005 |
| JP | 2005216921 A | 8/2005 |
| JP | 2005294577 A | 10/2005 |
| JP | 2005347442 A | 12/2005 |
| JP | 2005354120 A | 12/2005 |
| JP | 2006041148 A | 2/2006 |
| JP | 2006080199 | 3/2006 |
| JP | 2006120931 A | 5/2006 |
| JP | 2006269968 | 10/2006 |
| JP | 2007005403 A | 1/2007 |
| JP | 2007-053149 A | 3/2007 |
| JP | 2007-081304 | 3/2007 |
| JP | 2007096198 A | 4/2007 |
| JP | 2007-157844 A | 6/2007 |
| JP | 2007227512 | 9/2007 |
| JP | 2007250712 A | 9/2007 |
| JP | 2007-317887 A | 12/2007 |
| JP | 2008-085020 | 1/2008 |
| JP | 2008-091632 A | 4/2008 |
| JP | 2008147224 A | 6/2008 |
| JP | 2008147601 A | 6/2008 |
| JP | 2008-177249 A | 7/2008 |
| JP | 2008227335 A | 9/2008 |
| JP | 2008-258258 A | 10/2008 |
| JP | 2009016773 A | 1/2009 |
| JP | 2009-505401 A | 2/2009 |
| JP | 2009111367 | 5/2009 |
| JP | 2009224699 | 10/2009 |
| JP | 2010-028601 A | 2/2010 |
| JP | 2010093228 A | 4/2010 |
| JP | 2010147281 A | 7/2010 |
| JP | 2010157215 A | 7/2010 |
| JP | 2010245506 A | 10/2010 |
| KR | 19990088037 | 12/1999 |
| KR | 20040066018 A | 7/2004 |
| KR | 10-2005-0057533 | 6/2005 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| TW | 200933760 A | 8/2009 |
| TW | 201025501 A | 7/2010 |
| WO | 03/025998 A2 | 3/2003 |
| WO | 2004114397 | 12/2004 |
| WO | 2005022631 A1 | 3/2005 |
| WO | 2006004127 | 1/2006 |
| WO | 2007021639 A2 | 2/2007 |
| WO | 2008/054660 A2 | 5/2008 |
| WO | 2008108970 A2 | 9/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

International Search Report, PCT/US2008/002659, Oct. 17, 2008.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report and Written Opinion, PCT/US2008/009356 dated Feb. 19, 2009.
U.S. Appl. No. 12/784,841.
U.S. Appl. No. 12/842,717.
U.S. Appl. No. 12/842,612.
U.S. Appl. No. 12/842,651.
U.S. Appl. No. 12/723,039.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.
International Searching Authority, Search Report for Application No. PCT/US2011/060553 dated Jun. 27, 2012.
Taiwan Office Action for Application No. 100113585 dated Jun. 5, 2012.

(56) References Cited

OTHER PUBLICATIONS

International Search Report and Written Opinion for Application No. PCT/US2011/029394 dated Jun. 6, 2012.
Partial International Search Report for Application No. PCT/US2011/063653 dated Jul. 9, 2012.
International Search Report and Written Opinion for Application No. PCT/US2011/063653 dated Aug. 13, 2012.
Japanese Office Action for Application No. 2009-552696 dated Aug. 14, 2012.
Japanese Office Action for Application No. 2010-519953 dated Oct. 19, 2012.
International Search Report and Written Opinion for Application No. PCT/US2011/060553 dated Oct. 26, 2012.
International Written Opinion for Application No. PCT/US2011/063653 dated Jan. 14, 2013.
International Search Report Application No. PCT/US2011/029568, dated Aug. 30, 2011.
International Search Report Application No. PCT/US2011/029568, dated Oct. 21, 2011.
David R. Lide et al: 'Handbook of Chemistry and Physics, 77th Edition, 1996-1997', Jan. 1, 1997 (Jan. 1, 1997), CRC Press, Boca Raton, New York, London, Tokyo, XP002670569, pp. 12-90-12-91.
International Search Report and Written Opinion, PCT/US2011/063025, Mar. 19, 2012.
Chinese Office Action for Application No. 201010546793.9 dated Jun. 25, 2013.
Taiwanese Office Action for Application No. 099143374 dated Jun. 24, 2013.
Chinese Office Action for Application No. 201010546210.2 dated Aug. 21, 2013.
Preliminary Examination Report from Taiwan Application No. 099140226 dated Oct. 21, 2013.
Japanese Office Action for Application No. 2009-552696 dated Nov. 1, 2013.
Extended European Search Report for Application No. EP12189442 dated Mar. 6, 2014.
Taiwan Office Action for Application No. 100144451 dated Apr. 16, 2014.
Korean Office Action for Application No. 10-2010-7004471 dated May 29, 2014.
Taiwanese Office Action and Search Report for Application No. 100144456 dated Jul. 29, 2014.
Taiwanese Office Action for Application No. 100144452 dated Oct. 17, 2014.
Office Action for Taiwan Application No. 100145366 dated Nov. 21, 2014.
Chinese Office Action for Application No. 2013100226268 dated Feb. 4, 2015.
Japanese Office Action for Application 2013-541978 dated Feb. 24, 2015.
Japanese Office Action for Application No. 2014-146474 dated. Apr. 24, 2015.
Taiwanese Office Action for Application No. 100133520 dated Dec. 12, 2013.
Japanese Office Action for Application No. 2013-538966 dated Sep. 18, 2015.

\* cited by examiner

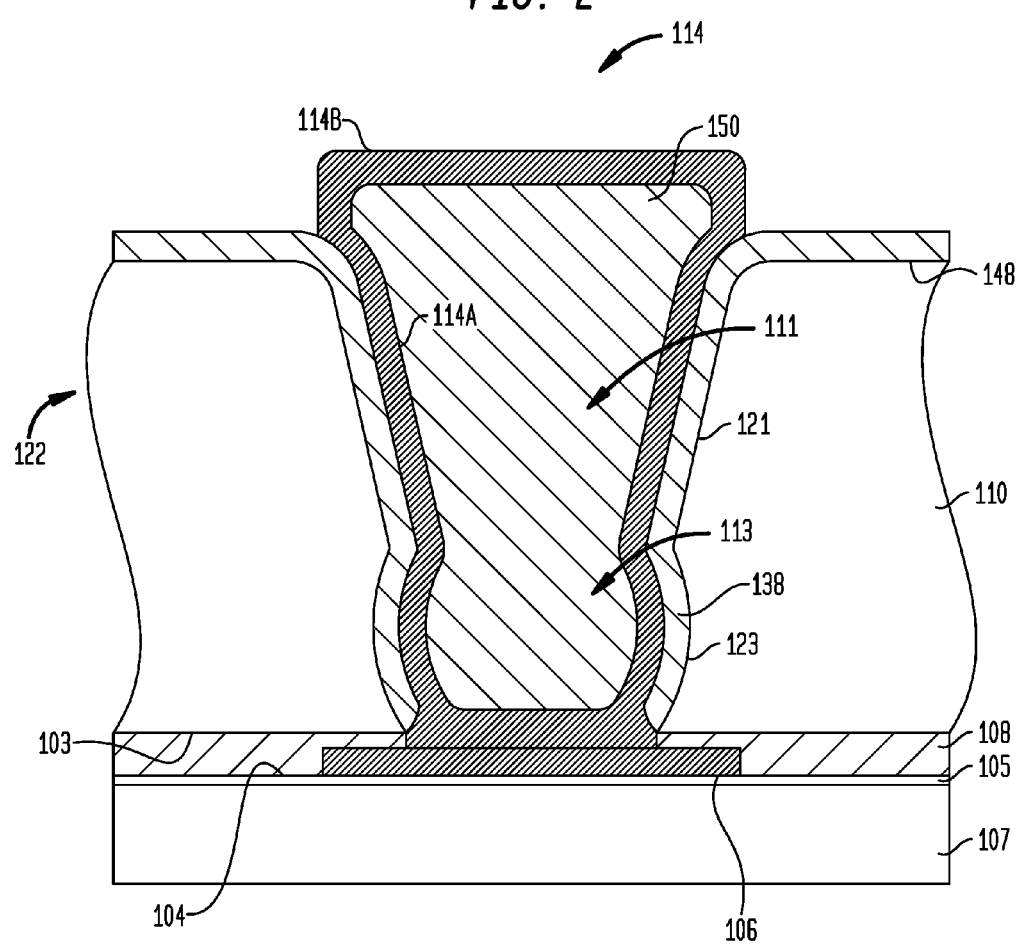

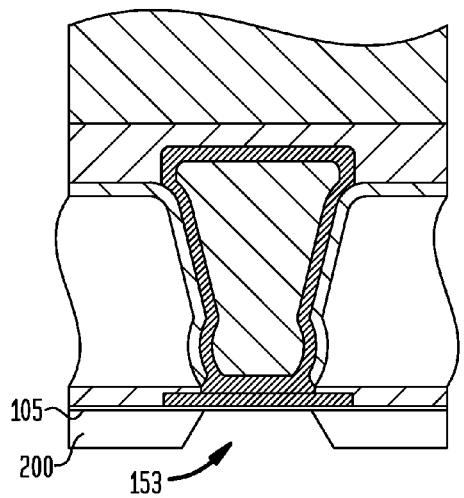
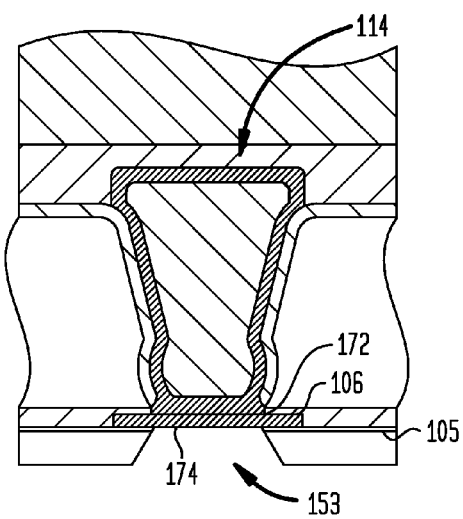
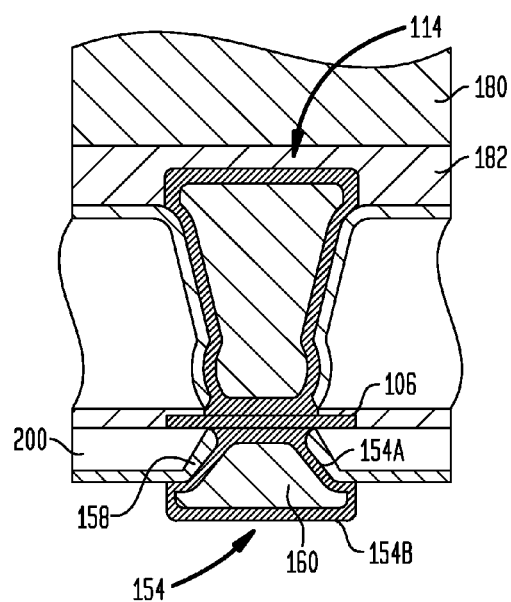

STACKED MICROELECTRONIC ASSEMBLY WITH TSVS FORMED IN STAGES AND CARRIER ABOVE CHIP

CROSS-REFERENCE TO RELATED APPLICATIONS

The present application is a continuation of U.S. patent application Ser. No. 14/224,379, filed Mar. 25, 2014, which is a divisional of U.S. patent application Ser. No. 13/051,424, filed Mar. 18, 2011, now U.S. Pat. No. 8,736,066, which claims the benefit of the filing date of U.S. Provisional Patent Application No. 61/419,033, filed Dec. 2, 2010, the disclosures of which are hereby incorporated herein by reference.

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (µm) thick. The bond pads could include a single layer or multiple layers of metal. The size of the bond pads will vary with the device type but will typically measure tens to hundreds of microns on a side.

Through-silicon vias (TSVs) can be used to provide electrical connections between the front surface of a semiconductor chip on which bond pads are disposed, and a rear surface of a semiconductor chip opposite the front surface. Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can be made to enhance the processes for making connections between front and rear chip surfaces, and to the structures which can result from such processes.

BRIEF DESCRIPTION OF THE DRAWINGS

FIG. 2 is a fragmentary sectional view particularly illustrating a microelectronic assembly in accordance with the microelectronic package of FIG. 1.

FIGS. 6, 7, 8, 9, 10, 11, 12, 13, 14, 15, and 16 are fragmentary sectional views illustrating stages in a method of fabricating a microelectronic assembly according to an embodiment of the invention.

DETAILED DESCRIPTION

Figure 1:
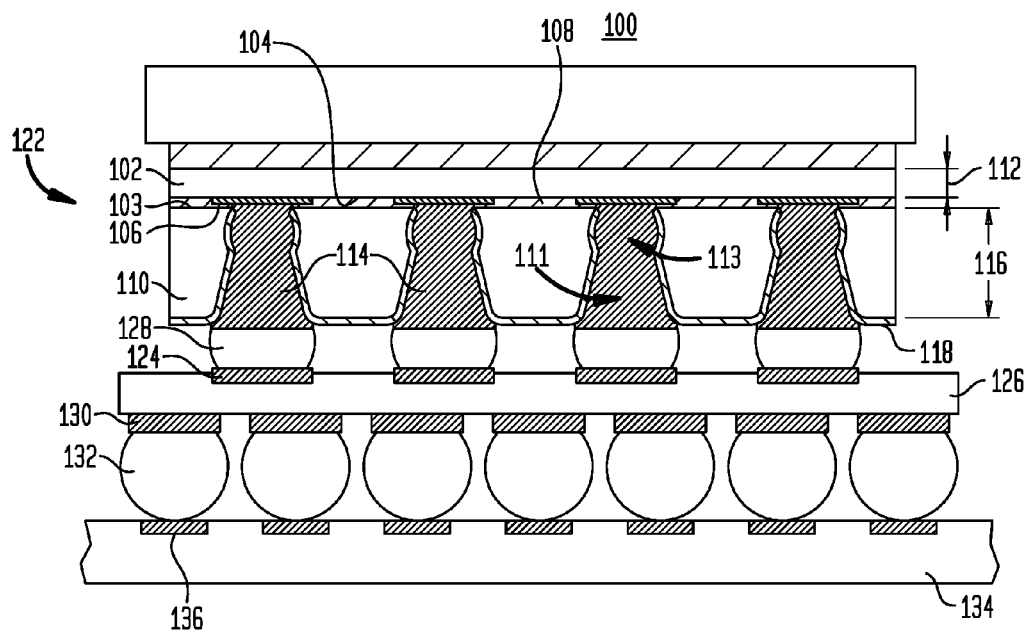
FIG. 1 is a sectional view illustrating a microelectronic package according to an embodiment of the invention, as attached to a circuit panel.
Figure 1A:
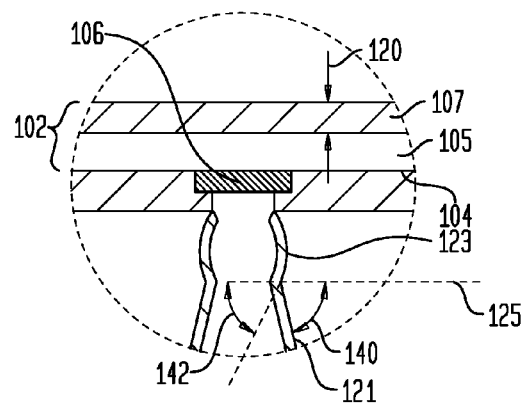
FIG. 1A is a fragmentary sectional view further illustrating the microelectronic package shown in FIG. 1.

FIG. 1 illustrates a microelectronic package 100 in accordance with an embodiment of the invention. The microelectronic package includes a microelectronic element 102, e.g., an integrated circuit embodied in a semiconductor chip, which can include silicon, an alloy of silicon, or other semiconductor material such as a III-V semiconductor material or II-VI semiconductor material. As seen in the enlarged view of FIG. 1A, the chip 102 has a front face 104, also referred to as a contact-bearing face, being a major surface of the chip, with a dielectric layer 105 of the chip exposed at the front face. The dielectric layer 105 overlies a semiconductor region 107 of the chip in which active semiconductor devices, e.g., transistors, diodes, or other active devices are provided. As further seen in FIG. 1, a plurality of conductive pads 106 are exposed at the front face 104.

In a particular embodiment, the dielectric layer 105 can include one or more layers of dielectric material having a low dielectric constant, i.e., a "low-k" dielectric layer, between and around the metal wiring patterns which provide electrical interconnection for the microelectronic element. Low-k dielectric materials include porous silicon dioxide, carbon-doped silicon dioxide, polymeric dielectrics, and porous polymeric dielectrics, among others. In a porous low-k dielectric layer, the dielectric layer can have substantial porosity, which reduces the dielectric constant of the dielectric material relative to a nonporous layer of the same material. Dielectric materials typically have a dielectric constant significantly above 1.0, but air which occupies open spaces within a porous dielectric material has a dielectric constant of about 1.0. In this way, some dielectric materials can achieve reductions in the dielectric constant by having substantial porosity.

However, some low-k dielectric materials, such as polymeric dielectric materials and porous dielectric materials, withstand much less mechanical stress than traditional dielectric materials. Particular types of operating environments and ways that the microelectronic element may be tested can present stress at or near a limit that the low-k dielectric material can tolerate. The microelectronic assemblies described herein provide improved protection for the low-k dielectric layer of a microelectronic element by moving the locations where stress is applied to the microelectronic element away from the low-k dielectric layer 105. In this way, manufacturing, operation and testing can apply much reduced stresses to the low-k dielectric layer, thus protecting the low-k dielectric layer. As further seen in FIG. 1, a surface 103 of a first element 110 is bonded to the front face 104 with a dielectric material 108 such as an adhesive. Other possible bonding materials can include glass, which in a particular embodiment, can be doped and can have a glass transition temperature below 500° C. The first element can consist essentially of semiconductor material or an inorganic dielectric material or other material having a coefficient of thermal expansion ("CTE") of less than 10 parts per million ("ppm") per degree Celsius: i.e. less than 10 ppm/° C. Typically, the first element 110 consists essentially of the same semiconductor material as the chip or consists essentially of dielectric material which has a CTE at or close to the CTE of the chip. In such case, the first element can be said to be "CTE-matched" with the chip. As further seen in FIG. 1, the first element 110 can have a plurality of "staged vias" for providing electrically conductive connections with the conductive pads 106 of the chip. For example, the first element can have a plurality of first openings 111 which extend from an exposed outwardly-facing surface 118 towards the chip front surface 104. A plurality of second openings 113 can extend from respective first openings 111 to respective conductive pads 106 of the chip. As further seen in FIG. 1A, at locations where the first and second openings meet, interior surfaces 121, 123 of the first and second openings extend at different angles 140, 142 relative to a plane defined by the major surface 104, which is the same as the angles 140, 142 relative to any plane 125 parallel to the major surface.

A plurality of conductive elements 114 extend within the first and second openings and are electrically coupled to the conductive pads 106. The conductive elements 114 are exposed at an exposed outwardly-facing surface 118 of the first element. In one example, the conductive elements 114 can include metal features which are formed by depositing a metal in contact with exposed surfaces of the conductive pads 106. Various metal deposition steps can be used to form the conductive elements, as described in further detail below. The first element can include one or more passive circuit elements, e.g., capacitors, resistors or inductors, or a combination thereof, which while not specifically shown in FIG. 1, can further contribute to the function of the chip and package 100.

As further provided by the package 100, the first element can function as a carrier which mechanically supports the chip. The thickness 112 of the chip typically is less than or equal to the thickness 116 of the first element. When the first element and the chip are CTE-matched and the first element is bonded to the front face of the chip, the chip can be relatively thin in comparison to the first element. For example, when the first element has a CTE that matches the chip, the thickness 112 of the chip may be only a few microns, because stresses applied to the conductive elements 114 are spread over the dimensions and thickness 116 of the first element, rather than being applied directly to the conductive pads 106. For example, in a particular embodiment, the thickness 120 of the semiconductor region 107 of the chip may be less than one micron to a few microns. The chip, the first element bonded thereto, and the conductive elements 114 together provided a microelectronic assembly 122 which can be mounted and further interconnected in a microelectronic package.

As further seen in FIG. 1, the conductive elements 114 can be conductively bonded, similar to flip-chip manner, to contacts 124 of a dielectric element 126, such as through masses 128 of a bond metal, e.g., solder, tin, indium, or a combination thereof. In turn, the dielectric element can have a plurality of terminals 130 for further electrically connecting the package 100 to corresponding contacts 136 of a circuit panel 134, such as through conductive masses 132, e.g., solder balls, projecting away from the dielectric element 126.

FIG. 2 is a partial sectional view further illustrating a structure of the microelectronic assembly 122. When the first element is made of semiconductor material, a dielectric layer 138 can be provided as a coating which may conform to contours of the interior surfaces 121, 123 of the first and second openings 111, 113. In one example, when the first element consists essentially of semiconductor material, such conformal dielectric layer 138 can be formed selectively by electrophoretic deposition on interior surfaces of the openings 111, 113, and on an exposed surface 148 of the first element, as will be described in further detail below. A conductive layer 114A can thereafter be formed within the openings, e.g., such as by depositing a metal or a conductive compound of a metal in contact with the conductive pad 106 and the dielectric layer 138. Thereafter, the volume remaining within the openings 111, 113 after forming the conductive layer can be filled with a dielectric material 150. A conductive contact 114B then can be formed atop the dielectric material 150 by subsequently depositing a conductive material, e.g., a metal over the dielectric material 150.

Figure 3:
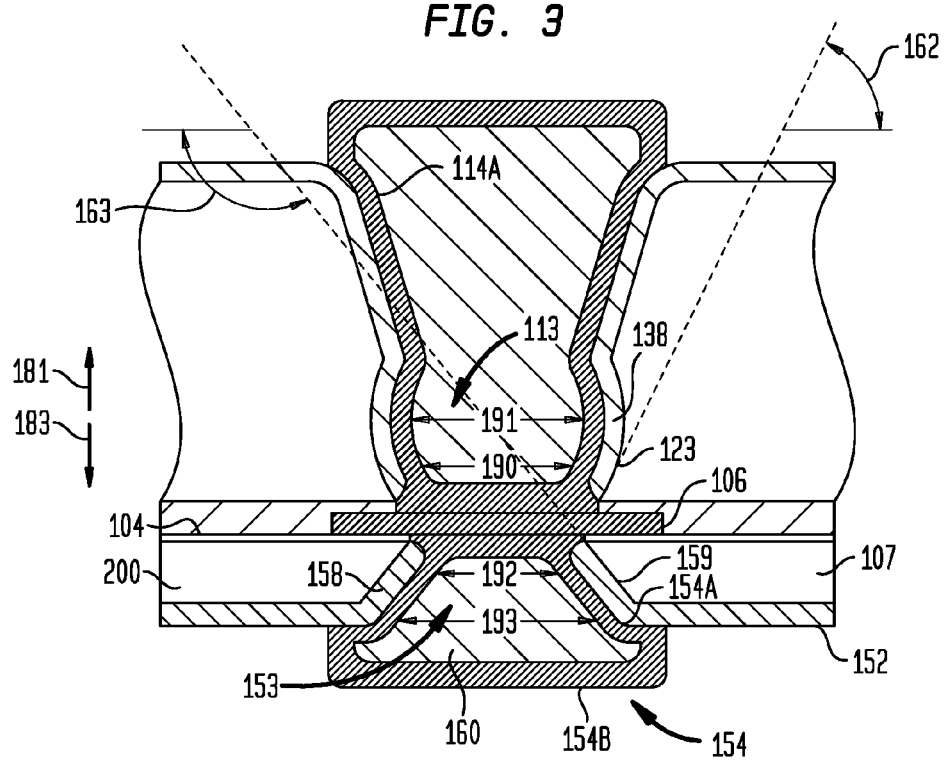
FIG. 3 is a fragmentary sectional view illustrating a microelectronic assembly according to a variation of the embodiment shown in FIG. 1.

FIG. 3 illustrates a variation of the embodiment shown in FIG. 2. In this variation, a second conductive element 154 is electrically coupled to the conductive pad 106 and is exposed at a major surface 152 of the chip, specifically a rear surface of the chip that is remote from the front surface 104. An opening 153 can extend from the rear surface 152 of the chip and expose at least a portion of the conductive pad 106. A dielectric layer 158 can line the opening 153 in the chip and electrically insulate the second conductive element 154 from the semiconductor region 107 of the chip. In the particular embodiment shown in FIG. 3, the dielectric layer 158 can conform to a contour of an interior surface 159 of the semiconductor region exposed within the opening 153. Moreover, like the conductive element 114, the second conductive element can include a conductive layer 154A extending along the dielectric layer 158, which can also conform to a contour of the interior surface 159 of the semiconductor region within the opening 153. As particularly shown in FIG. 3, similar to the first conductive contact 114 described above (FIG. 2), dielectric material 160 can be deposited over the conductive layer 154A and an exterior conductive contact 154B can be provided which overlies the dielectric material. As shown in FIG. 3, the second conductive contact 154B may overlie at least a portion of the conductive pad 106 to which it is directly or indirectly electrically coupled. As further seen in FIG. 3, interior surfaces 123, 159 of the openings in the packaging layer and the wafer have contours to which dielectric layers 138, 158 conform, and conductive layers 114A, 154A conform. The interior surfaces 123, 159, can extend at substantially different angles 162, 163 away from the front or major surface of the wafer, respectively. As a result, the widths 190, 192 of the openings 113, 153 where the conductive layers 114A, 154A meet the conductive pad can be smaller than the widths 191, 193 of the openings 113, 153, respectively, at substantial distances in respective directions 181, 183 from the conductive pad 106. In a particular embodiment, the openings 113, 153 may have their smallest widths 190, 192 where the openings meet the respective surfaces of the conductive pad 106.

Figure 3A:
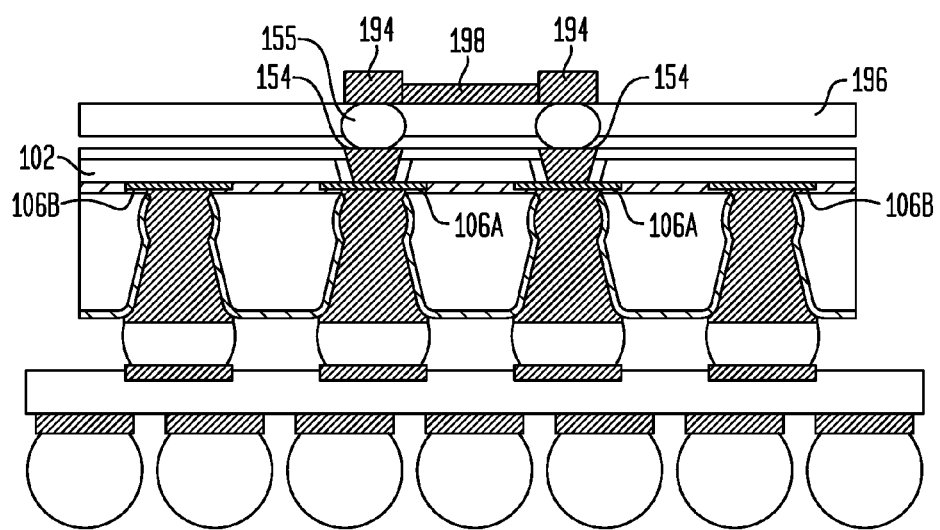
FIG. 3A is a sectional view illustrating a microelectronic package according to a variation of the embodiment shown in FIG. 1.

As will be further understood, the second conductive elements 154B are exposed at a surface of the wafer 200 and can be available for forming electrically conductive interconnections between the microelectronic assembly (FIG. 3) and a component external to the microelectronic assembly. For example, as further seen in FIG. 3A, some conductive pads 106A of a chip 102 of the microelectronic assembly can have conductive elements 154 exposed at the rear surface of the chip and be electrically interconnected by a bond metal 155, e.g., solder, with conductive features 194 such as conductive pads, on a second dielectric element 196. The dielectric element 196 may further include other features such as conductive traces 198 which can be electrically connected with the pads. As further seen in FIG. 3A, others 106B of the conductive pads may not have conductive elements 154 connected thereto and exposed at a rear surface of the chip 102.

Figure 4:
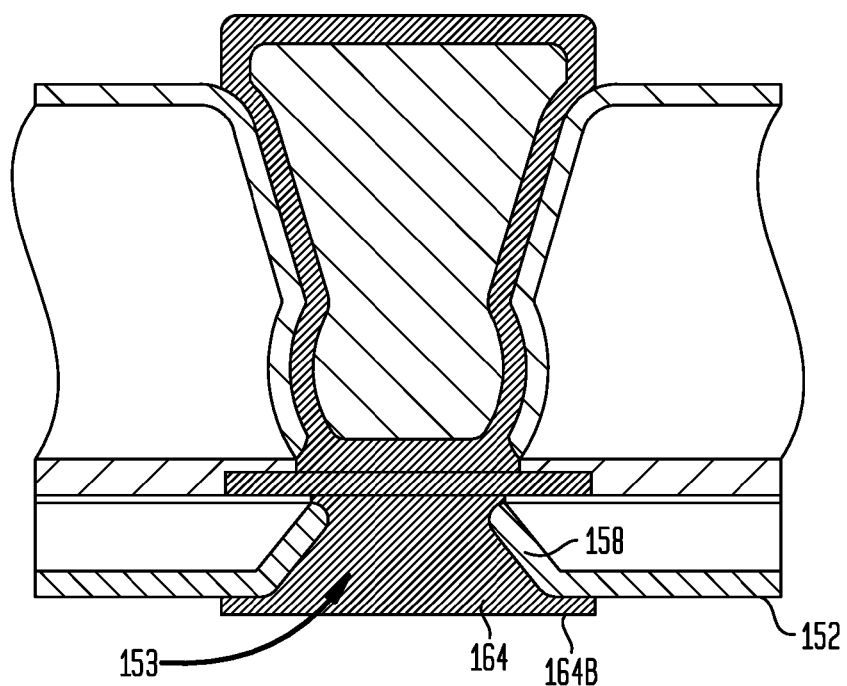
FIG. 4 is a fragmentary sectional view illustrating a microelectronic assembly according to a variation of the embodiment shown in FIG. 3.

FIG. 4 illustrates a further variation in which the second conductive element 164 is provided as a solid conductive structure. In this case, the second conductive element 164 at least substantially fills a volume within the opening in the chip that remains after forming the conformal dielectric coating 158. As further seen in FIG. 4, a conductive contact or pad portion 164B of the second conductive element can extend beyond the opening 153 along the rear surface 152 of the chip.

Figure 5:
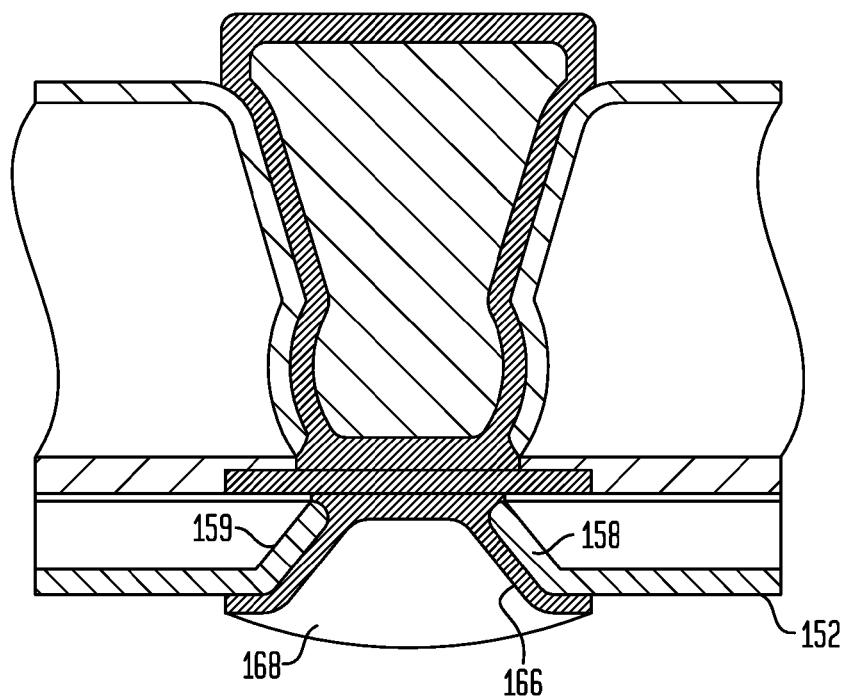
FIG. 5 is a fragmentary sectional view illustrating a microelectronic assembly according to a variation of the embodiment shown in FIG. 3.

FIG. 5 illustrates yet another variation in which the second conductive element includes a conductive layer 166 extending along the dielectric layer 158. As in the above-described embodiment, the dielectric layer 158 and the conductive layer 166 may conform to a contour of the interior surface 159 of the opening. As further shown in FIG. 5, a conductive mass 168, which can be a bond metal, e.g., solder, tin, indium, or a combination thereof, may be joined to the conductive layer. The conductive mass 168 may at least substantially fill the opening and, as shown in FIG. 5, may project beyond the rear surface 152 of the chip.

Figure 6:
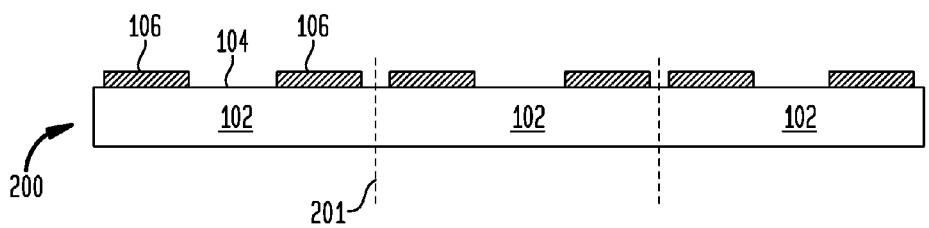
Figure 7:
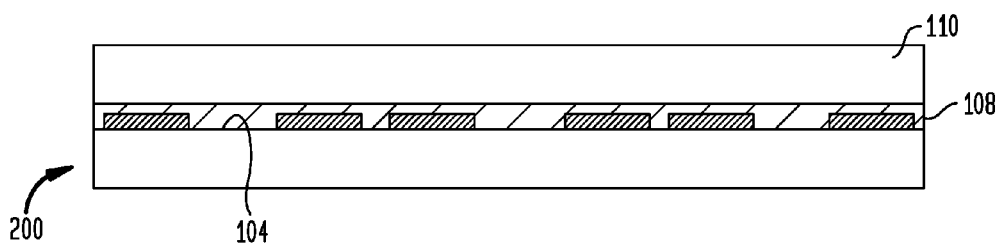

Referring to FIG. 6, a method of fabricating a microelectronic assembly in accordance with any of the above-described embodiments will now be described. As seen in FIG. 6, a semiconductor wafer 200 or portion of a wafer can include a plurality of semiconductor chips 102 which are attached together at dicing lanes 201. Each chip typically has a plurality of conductive pads 106 exposed at a front face 104 of the chip. As seen in FIG. 7, a packaging layer 110 such as an unpatterned semiconductor wafer or glass wafer or other element having a CTE of less than 10 ppm/° C. is bonded to the front face 104, such as through an adhesive 108 or other dielectric bonding material such as a doped glass having a relatively low melting temperature, such as a temperature below 500° C. The packaging layer 110 typically has a CTE which is close to or equal that of the semiconductor wafer 200. For example, when the semiconductor wafer 200 consists essentially of silicon, the packaging layer 110 can consist essentially of silicon to be CTE-matched with the wafer 200. Alternatively, a packaging layer 110 of doped glass can be CTE-matched with the semiconductor wafer 200. In a particular embodiment, when the packaging layer 110 is CTE-matched with the wafer 200, the dielectric bonding material can also be CTE-matched with the wafer 200.

Figure 8:
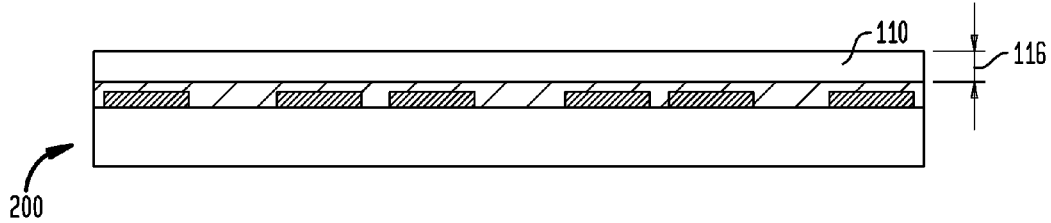

After bonding the packaging layer 110 to the wafer 200, a thickness of the packaging layer 110 can be reduced from an original thickness to a reduced thickness 116, as shown in FIG. 8. The packaging layer 110 can be reduced in thickness by a process of grinding, lapping or polishing, or combination thereof. In one embodiment, the reduced thickness 116 that is reached during this process can be a final thickness of the packaging layer 110.

Hereinafter, a series of fragmentary sectional views are used to illustrate stages in a method of fabricating a microelectronic assembly according to an embodiment of the invention. The steps shown therein may typically be performed at wafer-level, i.e., prior to severing a semiconductor wafer (FIG. 6) into individual chips 102, although in each figure, only a portion of an individual chip may appear. The following description of a method of fabricating the microelectronic assembly should be understood to cover either chip-level or wafer-level fabrication techniques, whether or not the same is specifically described, and whether or not the following description makes reference to processes performed with respect to a wafer, or to a chip.

Figure 9:
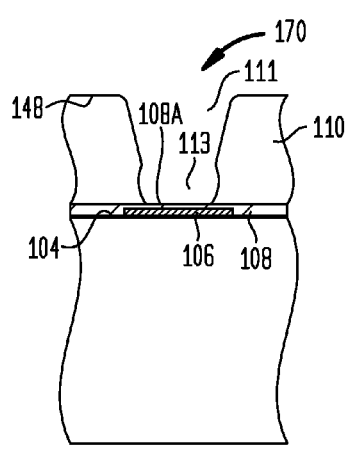
Figure 10:
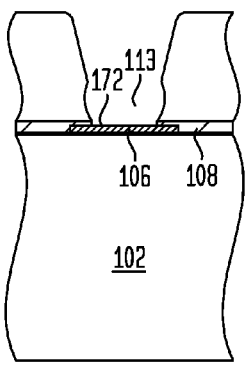

FIG. 9 illustrates a stage of fabrication subsequent to the stage illustrated in FIG. 8. As shown therein, an opening 170 is formed which extends from an exterior surface 148 of the packaging layer 110 to a surface 108A of the dielectric bonding layer 108 overlying a conductive pad 106. The opening 170 can be formed in a staged manner as a first opening 111 extending from the exposed surface 148 of the packaging layer 110 towards the chip front surface 104, and a second opening 113 extending from the first opening further towards the chip front surface 104. In one embodiment, the first and second openings 111, 113 can be formed by forming the first opening such as through etching, laser ablation, or by "sand-blasting", i.e., by directing a stream of micro-abrasive particles toward the packaging layer. Thereafter, the process can further include forming a dielectric layer (not shown) lining an interior surface of the first opening 111, forming a hole in such dielectric layer, and then forming the second opening 113 by etching the packaging layer through the hole until a surface of the bonding layer 108 is exposed. When etching the packaging layer 110 to form the second opening, the dielectric layer in the first opening can function as a mask such that the packaging layer is etched where exposed within the hole in the dielectric layer and the dielectric layer protects portions of the packaging layer away from the hole from being etched. Thereafter, as illustrated in FIG. 10, a portion of the bonding layer 108 exposed within the second opening 113 and overlying the conductive pad 106 is removed so as to expose at least a portion of an upper surface 172 of the pad which faces outwardly away from the chip 102.

The process of forming the first and second openings can be as generally described in any or all of United States Patent Publication No. 20080246136A1, or United States applications, each filed Jul. 23, 2010: application Ser. Nos. 12/842,717, 12/842,612, 12/842,669; 12/842,692; 12/842,587, the disclosures of which are incorporated herein by reference, with the exception that the first and second openings extend through a packaging layer and a bonding layer rather than through the chip, and the second opening exposes a portion of an outwardly-facing upper surface of a conductive pad rather than the lower pad surface.

Figure 11:
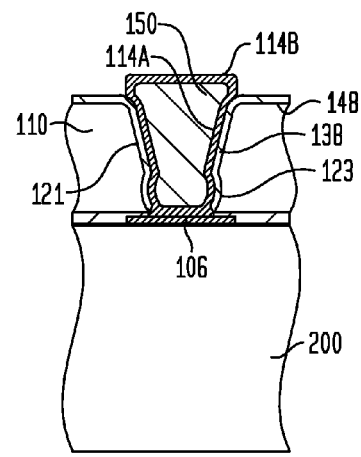

As further seen in FIG. 11, a dielectric layer 138 can be formed which extends along interior surfaces 121 and 123 of the first and second openings, respectively, and overlying an outwardly-facing surface 148 of the packaging layer 110. In one example, an electrophoretic deposition technique can be used to form a dielectric coating 138 conformally with respect to the interior surfaces 121, 123 of the openings and the packaging layer surface 148. In this way, the conformal dielectric coating may be deposited only onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 138 on exposed surfaces of the device wafer which are conductive or semiconductive, including but not limited to along the outwardly-facing surface 148, the interior surface 121 of the first opening 111, and the interior surface 123 of the second opening 113. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on the surface 108A of the dielectric bonding layer 108 overlying the upper surface 172 of the conductive pad 106, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 138 can be formed from a cathodic epoxy deposition precursor. Alternatively, a polyurethane or acrylic deposition precursor could be used. A variety of electrophoretic coating precursor compositions and sources of supply are listed in Table 1 below.

The dielectric layer 138 formed in this manner can conform to contours of the interior surfaces 121, 123 of the first and second openings.

After forming the dielectric layer 138, a conductive layer 114A (FIG. 11) can be formed within the openings 111, 113, which, when formed over a conformal dielectric layer 138, also can conform to contours of the interior surfaces 121,

TABLE 1

| ECOAT NAME | POWERCRON | POWERCRON 648 | CATHOGUARD 325 |
|---|---|---|---|
| | MANUFACTURERS | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| | APPLICATION DATA | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| | FILM PROPERTIES | | |
| COLOR | Black | Black | Black |
| THICKNESS, μm | 10-35 | 10-38 | 13-36 |
| PENCIL HARDNESS | | 2H+ | 4H |
| | BATH CHARACTERISTICS | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| | MANUFACTURERS | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| | APPLICATION DATA | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| | FILM PROPERTIES | | |
| COLOR | Clear (+dyed) | Black | Black |
| THICKNESS, μm | | 10-35 | 10-35 |
| PENCIL HARDNESS | 4H | | |
| | BATH CHARACTERISTICS | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

123 of the first and second openings. The deposition of an additional dielectric layer 150 and the forming of a metal layer 114B overlying the dielectric layer 150 completes a conductive element 114 exposed at an outwardly-facing surface of the packaging layer. The conductive element extends within the first and second openings 111, 113 and is electrically coupled to the conductive pad 106. A plurality of such conductive elements 114 can be simultaneously formed within respective openings in the packaging layer, the conductive elements electrically coupled to respective conductive pads 106 of the wafer 200.

Figure 12:
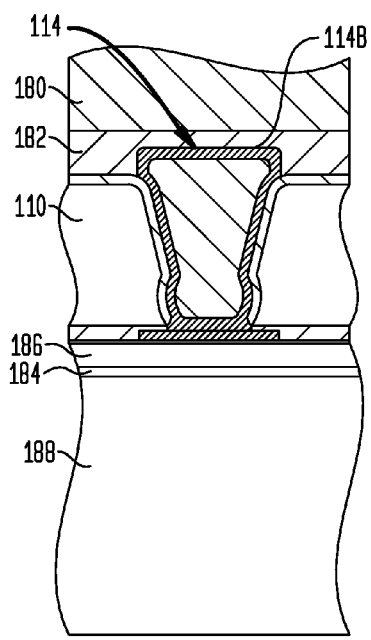

Thereafter, as seen in FIG. 12, a temporary carrier 180 or handle wafer can be attached to the exposed surface of the packaging layer 110 overlying exposed contacts 114B of the conductive elements 114. The carrier 180 can be attached, for example, using an adhesive 182 which can be removed after subsequent processing as described below.

Figure 13:
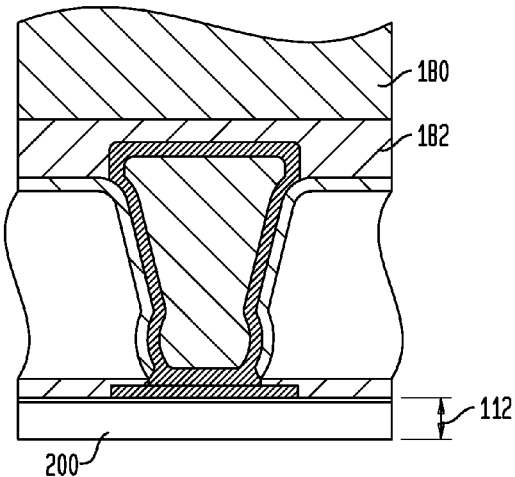

As further shown in FIG. 13, a thickness of the wafer 200 can be reduced to a value which may be a final thickness 112 of the wafer. Grinding, lapping or polishing may be used to reduce the wafer thickness. In a particular embodiment, the reduced thickness may range from 0.5 microns to only a few microns. In one possible implementation, the final thickness 112 of the wafer 200 can be controlled by the presence of a dielectric layer 184 (FIG. 12) buried within the wafer 200 which separates an upper portion 186 of the wafer adjacent the front surface, and having thickness 112, from a lower portion 188 opposite therefrom. In one embodiment, the buried dielectric layer 184 can be a buried oxide layer provided in a semiconductor-on-insulator or silicon-on-insulator wafer structure of wafer 200 before fabricating active semiconductor devices in the wafer 200. In such case, the lower wafer portion 188 can be monocrystalline or polycrystalline semiconductor material. Then, after reaching the fabrication stage shown in FIG. 13, the carrier 180 and adhesive 182 can be removed from the structure, resulting in the microelectronic assembly 122 shown in FIG. 2.

Alternatively, without detaching the carrier from the packaging layer 110, steps can be performed to fabricate a microelectronic assembly which further includes a second conductive element 154 as seen in FIG. 3. Specifically, as seen in FIG. 14, an opening 153 can be formed which extends through the thickness of the semiconductor region of the wafer 200. As seen in FIG. 14, the opening can be formed in a manner selective to dielectric layer 105 of the wafer. The dielectric layer 105 can include a plurality of interlevel dielectric ("ILD") layers in which metal wiring is provided, one or more passivation layers overlying the ILD layers, or both. Thus, the opening 153 exposes a portion of the dielectric layer 105 without extending through the dielectric layer 153.

Next, as seen in FIG. 15, the opening 153 is extended through the dielectric layer 105 to expose at least a portion of a lower surface 174 of the conductive pad 106. The lower surface 174 is opposite an upper surface 172 of the pad from which the first conductive element 114 extends, as illustrated in FIG. 15. Thereafter, as seen in FIG. 16, a conformal dielectric layer 158 and then a conformal conductive layer, typically of metal or a conductive metal compound, can be formed which extends at least partly within the opening so as to form a second conductive element 154 including a conductive layer which is electrically coupled to the conductive pad 106 and which typically is electrically insulated from the wafer 200 by the dielectric layer 158. Further processing can include the forming of a dielectric layer 160 overlying the conductive layer 154A, and a conductive contact 154B, typically of a metal or conductive metal compound can then be formed which overlies the dielectric layer 160.

Thereafter, the carrier and bonding layer 182 can be detached, resulting in a microelectronic assembly as seen in FIG. 3.

In a variation of the above-described embodiment, instead of forming a conformal conductive layer 154A on dielectric layer 158 and then forming an additional dielectric layer 160 overlying the conductive layer within the opening in the wafer 200 as seen in FIG. 16, a conductive layer 164 (FIG. 4) can be formed so as to provide a conductive contact 164 exposed at the rear face 152 of the wafer and extending to the conductive pad 160 without the additional dielectric layer 160 separating the contact 164 from the conductive pad.

Figure 17:
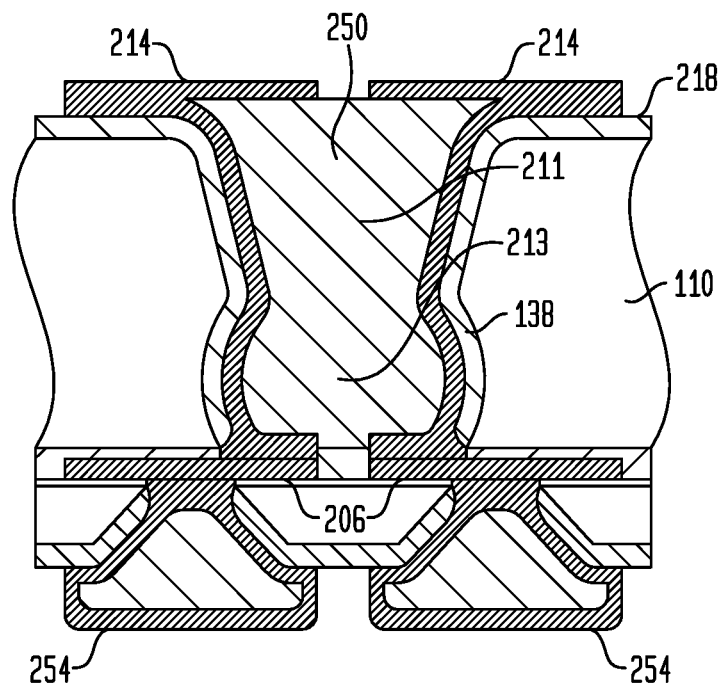
FIG. 17 is a fragmentary sectional view illustrating a microelectronic assembly in accordance with a variation of the embodiment of the invention shown in FIG. 3.

FIG. 17 illustrates a variation of the embodiment seen in FIG. 16, in which the second opening 213 within the packaging layer 110 exposes first and second conductive pads 206. As further seen in FIG. 17, a plurality of conductive elements 214 can be formed which extend from respective conductive pads 206 to surfaces overlying an outwardly-facing exposed surface 218 of the packaging layer 110. The conductive elements 214 may be electrically insulated from one another by the dielectric layer 138 extending along interior surfaces of the first and second openings 211, 213, and the additional dielectric layer 250 which may substantially or fully fill the remaining volume within the openings 211, 213. As seen in FIG. 17, portions of the conductive elements 214 can extend as pads or traces over the additional dielectric layer 250 within opening 211. However, in an alternative embodiment, the conductive elements may have portions which are only exposed at locations beyond the opening 211 in the packaging layer.

Moreover, as in the above-described embodiments (FIG. 2, FIG. 3), optional second conductive elements 254 can extend from the conductive pads 206 and be exposed at a rear surface of the wafer or chip 102 to permit electrical interconnections to be formed to an external component.

Figure 18:
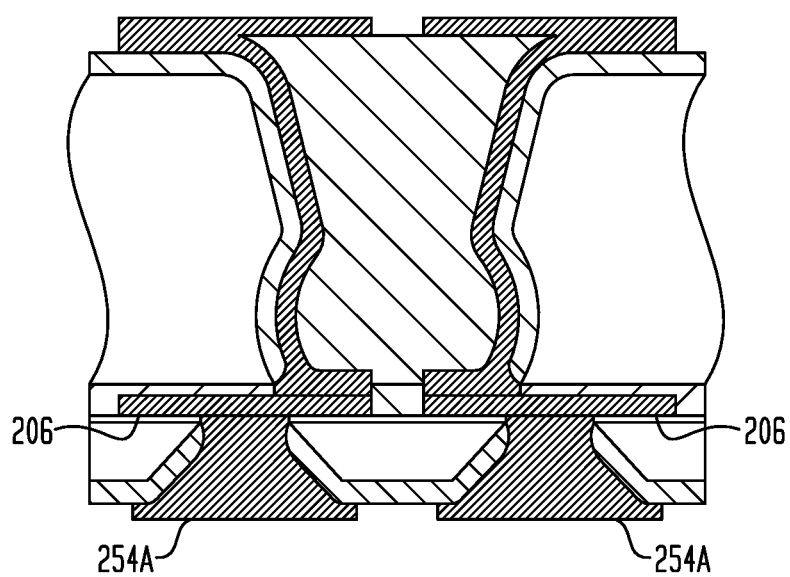
FIG. 18 is a fragmentary sectional view illustrating a microelectronic assembly in accordance with a variation of the embodiment of the invention shown in FIG. 17.

FIG. 18 illustrates a variation of the embodiment (FIG. 17) in which the dielectric fill material is omitted when forming the second conductive elements, such that the conductive material is continuous between the conductive pads 206 and surfaces 254A of the conductive material which are exposed for interconnection with an external component. In a particular embodiment, the second conductive elements 254A can have a structure as described above with reference to FIG. 5 in which a bond metal 168 is joined to a conductive layer 166 within the opening and is exposed at a surface 152 of the microelectronic assembly.

Figure 19:
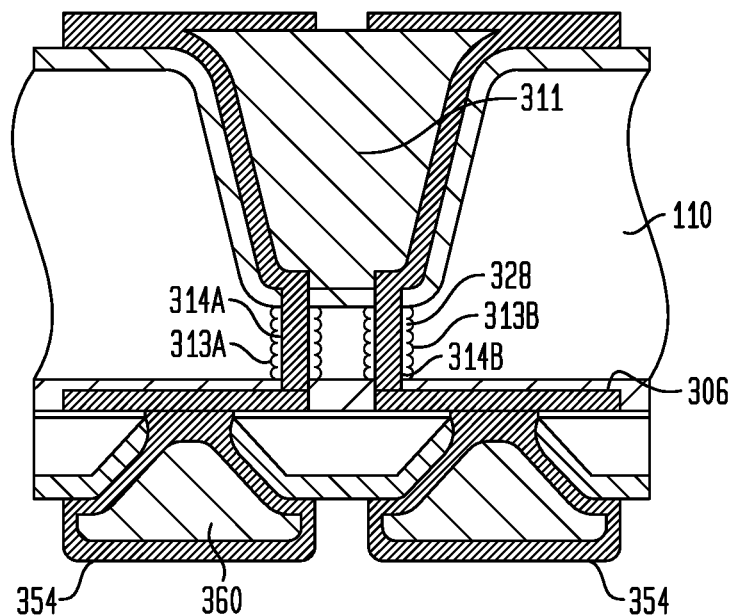
FIG. 19 is a fragmentary sectional view illustrating a microelectronic assembly in accordance with a variation of the embodiment of the invention shown in FIG. 17.
Figure 20:
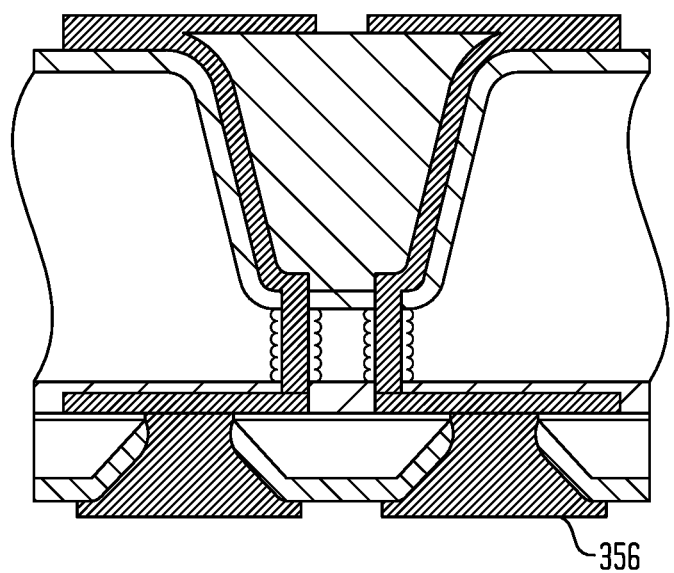
FIG. 20 is a fragmentary sectional view illustrating a microelectronic assembly in accordance with a variation of the embodiment of the invention shown in FIG. 19.

FIG. 19 illustrates a further variation in which a plurality of second openings 313A, 313B extend from a particular first opening 311 in the packaging layer 110. The second openings can be formed by laser drilling or other substantially vertical patterning method, e.g., a reactive ion etch ("RIE"), for example, after which dielectric layers 328 are formed to line interior surfaces of the second openings. The conductive elements 314A, 314B may substantially or fully fill the volume remaining within the second openings 313A, 313B after forming the dielectric layers 328. As further seen in FIG. 19, the conductive elements 314A, 314B may contact edges of the conductive pads 306 exposed at the surface of the wafer 200. The second conductive elements 354 which are exposed at a rear surface of the wafer can overlie a dielectric layer 360 within the opening, or the second conductive elements 356 can have a structure as seen in FIG. 20 which need not include a dielectric layer between the conductive pads and exposed surfaces of the conductive elements.

Figure 21:
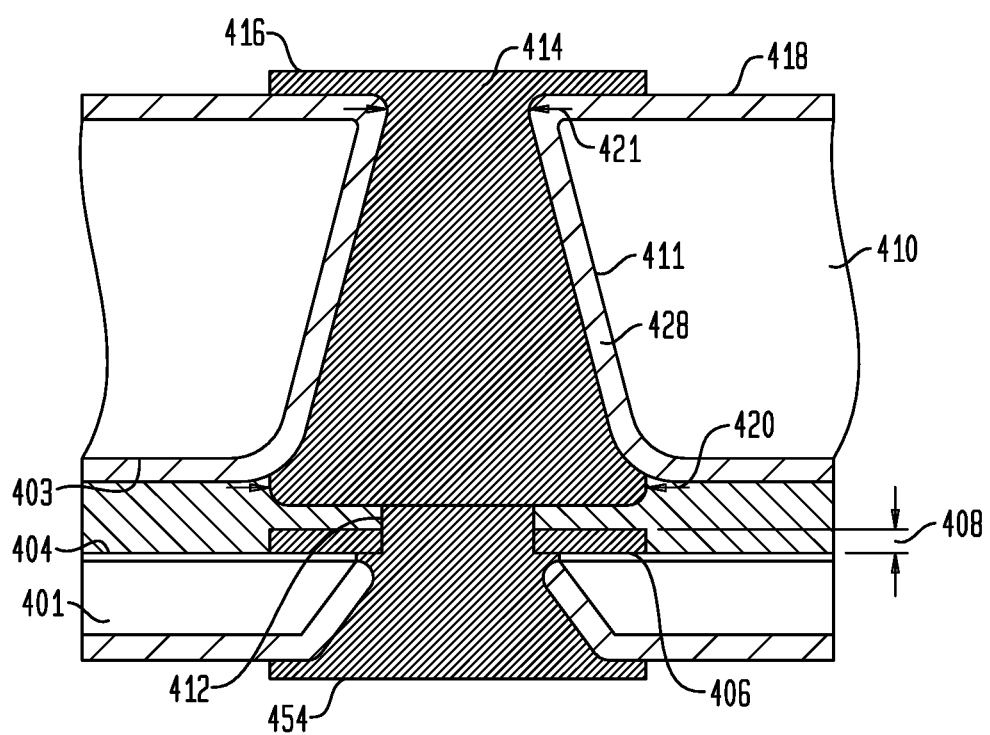
FIG. 21 is a fragmentary sectional view illustrating a microelectronic assembly in accordance with a variation of the embodiment of the invention shown in FIG. 3.

FIG. 21 illustrates a microelectronic assembly according to another embodiment of the invention in which a conductive element 414 having a contact pad 416 exposed at an exterior surface 418 of packaging layer 410 has a reentrant profile. Stated another way, the conductive element 414 can have a shape which varies between a relatively large width 420 adjacent a conductive pad 406 of wafer 401 and a smaller width 421 adjacent an exposed surface 418 of the packaging layer. As in the above embodiment (e.g., FIGS. 1, 3), the packaging layer can consist essentially of a semiconductor material, with a dielectric layer 416 disposed between an interior surface of an opening 411 therein and the conductive element 414. As further seen in FIG. 21, a second conductive element 454 exposed at an exterior surface of wafer 401 can extend through the conductive pad 406 in a direction of a thickness 408 of the pad 406. In one embodiment, as seen in FIG. 21, the second conductive element 454 can have a connecting portion 412 which electrically contacts the first conductive element 414 at a height of the assembly that is between adjacent surfaces of the wafer 401 and packaging layer 410.

Figure 22:
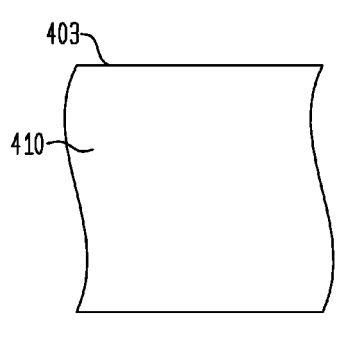
FIGS. 22, 23, 24, 25, 26, 27, 28, 29, 30, 31 and 32 are fragmentary sectional views illustrating stages in a method of fabricating a microelectronic assembly shown in FIG. 21, according to an embodiment of the invention.
Figure 23:
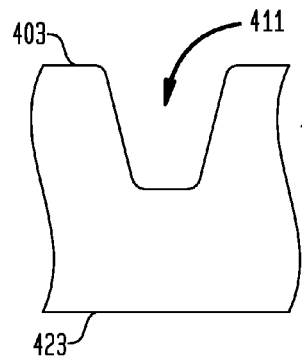
Figure 24:
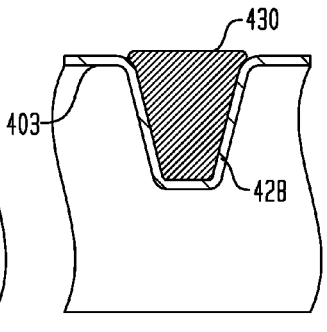

A process capable of forming the microelectronic assembly (FIG. 21) will now be described. In an initial stage of fabrication (FIGS. 22-23), an opening 411 is formed which extends from a major surface of a packaging layer 410 such as a semiconductor wafer towards a second major surface 423 of the packaging layer opposite therefrom. Thereafter, as seen in FIG. 24, a dielectric layer can be formed which lines an interior surface of the opening and overlies major surface 403. Thereafter, a metal layer or conductive compound of a metal or both can be deposited therein to fill the opening and form a first conductive element 430. A plurality of such conductive elements 430 can be formed simultaneously which extend from surface 403 of the wafer toward surface 423.

Figure 25:
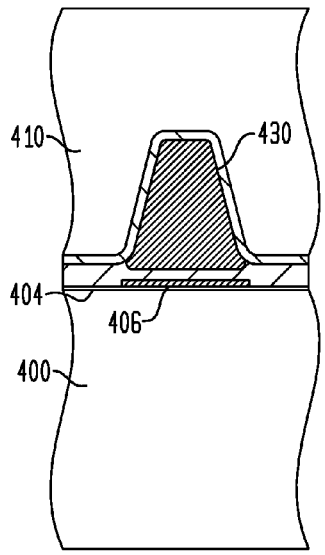

Thereafter, as illustrated in FIG. 25, the packaging layer 410 can be bonded to a device wafer 400 which has active semiconductor devices therein and a plurality of conductive pads 406 exposed at a front face 404 thereof. The conductive elements 430 of the packaging layer 410 can be mated with corresponding conductive pads 406 of the device wafer such that the conductive elements 430 at least partially overlie the respective conductive pads 406.

Figure 26:
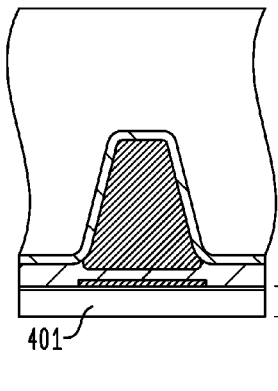
Figure 27:
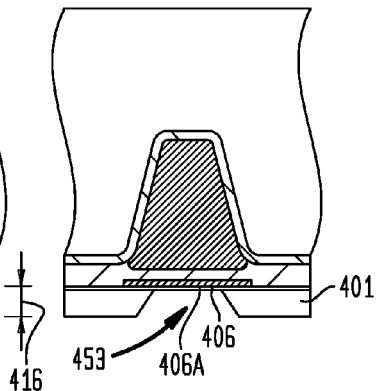

Subsequently, as illustrated in FIG. 26, a thickness of the device wafer 400 can be reduced to a thickness 416, such as described above relative to FIG. 2 to provide a thinned wafer 401. Then, as seen in FIG. 27, an opening 453 can be formed which extends through a semiconductor region of the wafer 401. For example, an etching process can be used which is performed selectively with respect to a dielectric layer (not shown), e.g., a series of ILD layers and a passivation layer which may underlie a lower surface 406A of the conductive pad.

Figure 28:
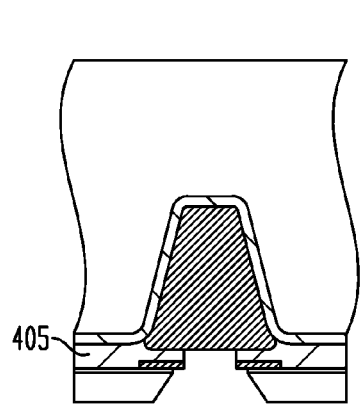
Figure 29:
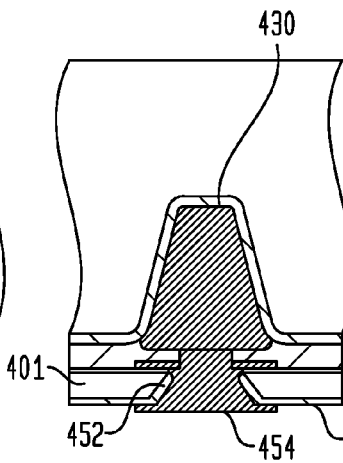

Next, as illustrated in FIG. 28, a further opening can be formed which extends through the dielectric layer (not shown), the conductive pad 406 and a bonding layer 405 between the thinned wafer 401 and the packaging layer 410. Then, as illustrated in FIG. 29, a dielectric layer 452 is formed within the opening, such as by an electrolytic technique as described in the foregoing. The second conductive element 454 can then be formed in contact with the first conductive element 430. A portion of the second conductive element 454 may overlie the rear surface 452 of the thinned wafer 401, with the dielectric layer 452 disposed between the semiconductor region and the second conductive element 454.

Figure 30:
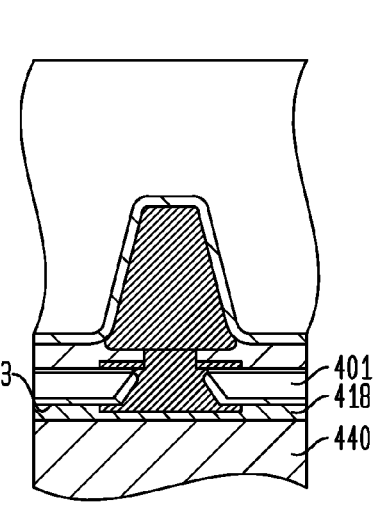
Figure 31:
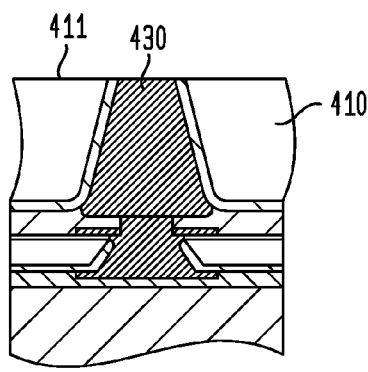
Figure 32:
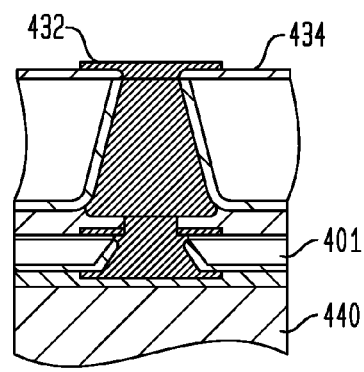

As seen in FIG. 30, a temporary support wafer or carrier 440 can be bonded to the rear surface 453 of the wafer 401 using a temporary adhesive 418. Thereafter, as seen in FIG. 31, a thickness of the packaging layer 410 can be reduced, e.g., by grinding, lapping or polishing, until at least some of the first conductive elements 430 are at least partially exposed at an exposed surface 411 of the packaging layer 410. Then, an additional dielectric layer 434 and a conductive pad 432 (FIG. 32) can be optionally formed atop the dielectric layer 434 and in contact with the first conductive element to provide a structure as illustrated in FIG. 32. Subsequently, the temporary carrier 440 can be detached from the device wafer 401 to provide a completed microelectronic assembly as seen, for example, in FIG. 21.

Figure 33:
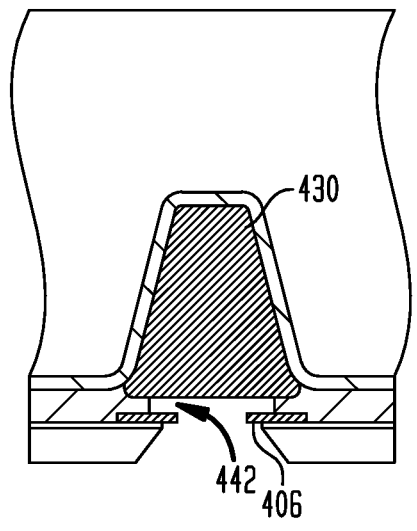
FIGS. 33, 34, and 35 are fragmentary sectional views illustrating stages in a method of fabricating a microelectronic assembly according to a variation of the embodiment shown in FIG. 21.

Referring now to FIG. 33, in a variation of the above-described fabrication method (FIGS. 21-32), a wet etch step or other etch step can be performed in conjunction with the processing shown in FIG. 28. The wet etch step can be performed in a manner which does not attack materials which are exposed at exposed surfaces of the first conductive elements 430 and the conductive pads 406. In such case, the wet etch step can produce undercut regions 442 between the first conductive elements 430 and conductive pads 406 adjacent thereto.

Figure 34:
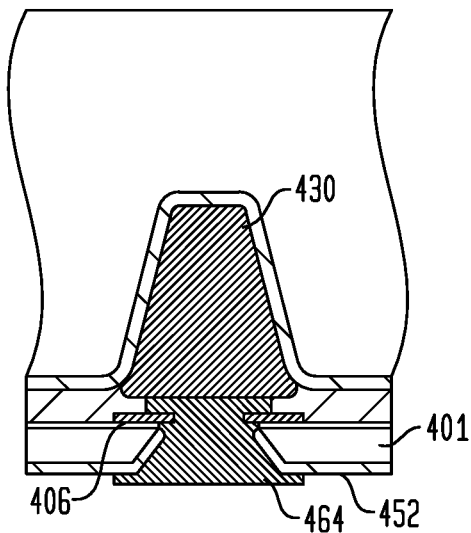
Figure 35:
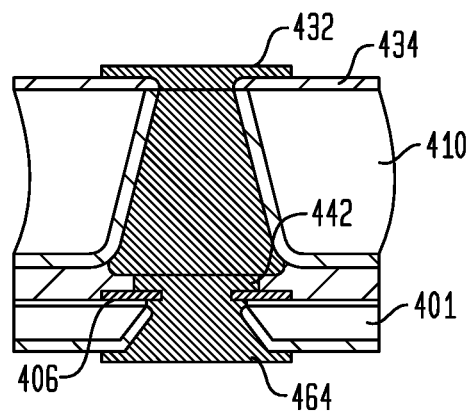

Subsequently, as shown in FIG. 34, the dielectric layer 452 can then be formed and a region 464 of metal or a conductive compound of a metal can be deposited onto the first conductive element 430, deposited within the undercut regions and onto surfaces of the conductive pads 406 and the dielectric layer 452 to produce a structure as seen in FIG. 34. With the metal regions 464 of the second conductive elements deposited within the undercut regions 442, the metal regions may have greater surface area in contact with the conductive pads 406 of the wafer 401. In this way, it may be possible to achieve improved process tolerances or improved reliability in the final structural connection between the conductive pads 406 and the first and second conductive elements. Thereafter, further processing as described above (FIGS. 31-32) can be performed to produce the microelectronic assembly as seen in FIG. 35.

Figure 36:
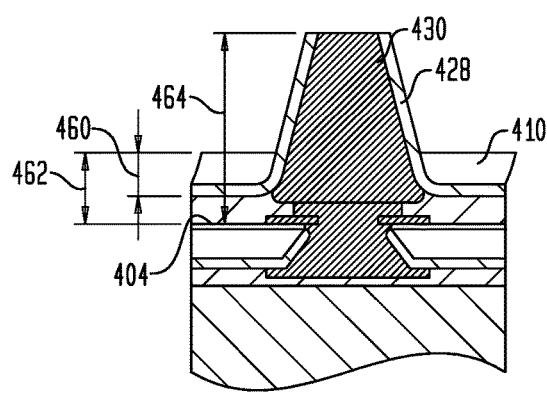
FIGS. 36 and 37 are fragmentary sectional views illustrating stages in a method of fabricating a microelectronic assembly according to a variation of the embodiment shown in FIG. 21.
Figure 37:
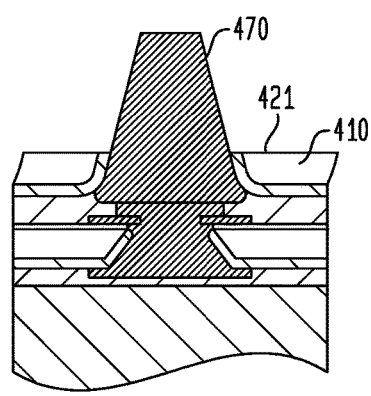

In another variation, when thinning the packaging layer 410 as seen in FIG. 36, the thickness 460 of the packaging layer can be reduced even further, such that the remaining height 462 of the packaging layer from the device wafer front surface 404 is below a maximum height 464 of the first conductive elements 430 from the device wafer front surface. Thereafter, portions of the dielectric layer 428 which are exposed above the reduced height 462 of the packaging layer can be removed from the structure to produce a structure as represented in FIG. 37 in which a plurality of conductive posts 470 have substantial portions projecting above an exposed surface 421 of the packaging layer. Moreover, when the posts 470 are formed by electroplating or depositing a metal which has substantially rigidity at normal chip operating temperature ranges, e.g., such as copper, nickel, aluminum, etc., refractory metals, e.g., tungsten, titanium, and the like, the posts 470 can be substantially rigid.

Figure 38:
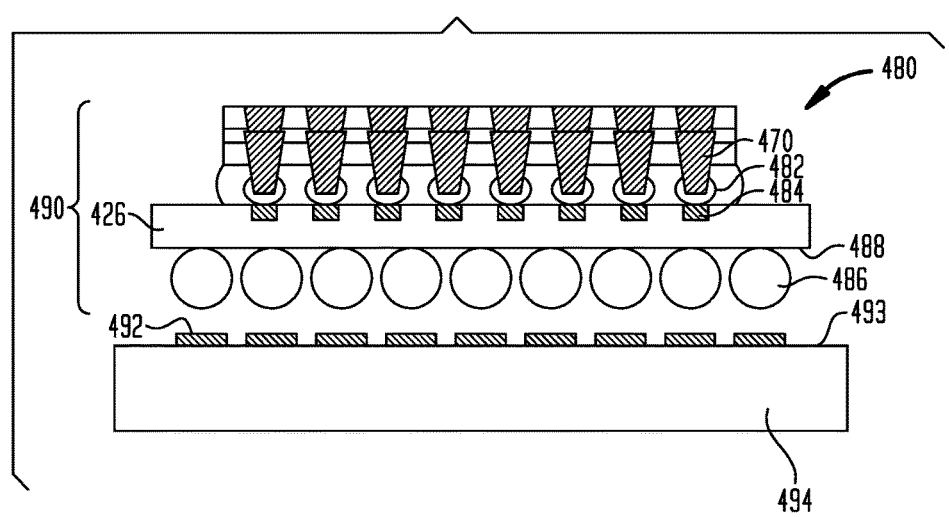
FIG. 38 is a sectional view illustrating a microelectronic package positioned above a circuit panel to be joined therewith, in a variation of the embodiment shown in FIG. 3A.

FIG. 38 further illustrates possible further interconnection arrangement of the microelectronic assembly resulting from such variation (FIGS. 36-37). As seen in FIG. 38, the substantially rigid conductive posts 470 of the microelectronic assembly 480 can be mounted via solder-masses 482 to corresponding contacts 484 on a dielectric element 426 to form a microelectronic package 490. In turn, the contacts 484 can be electrically connected with joining units 486, e.g., solder balls or other masses of a bond metal such as tin or indium or a combination thereof which are exposed at a lower surface 488 of the dielectric element 426. As further shown in FIG. 38, the joining units 486 can be used to join the package 490 to corresponding contacts 492 exposed at a surface 493 of a circuit panel 494.

Figure 39:
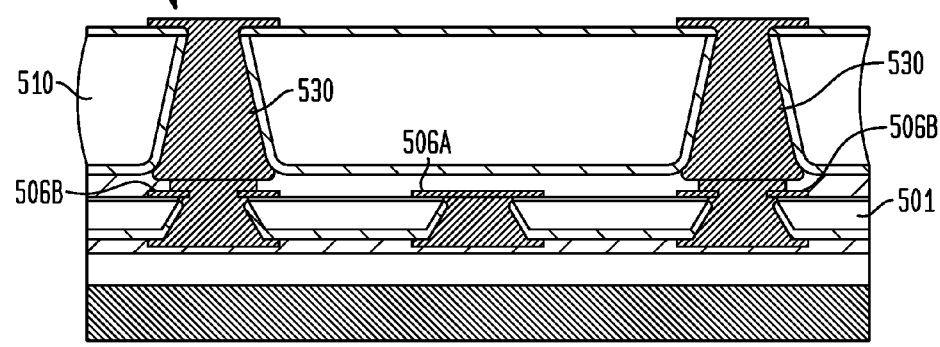
FIG. 39 is a sectional view illustrating a microelectronic assembly according to a variation of the embodiment shown in FIG. 21.

FIG. 39 illustrates a microelectronic assembly 590 according to a further variation, showing that not all of the conductive pads of a wafer 501, particularly conductive pad 506A, need to be connected with a first conductive element 530. To form the assembly 590, the first conductive element at a position corresponding to pad 506A can be omitted when forming the first conductive elements of the packaging layer 510. After bonding the device wafer with the packaging layer and forming openings 453 overlying the conductive pads as described above with respect to FIG. 27, a blocking layer such as a resist pattern can be used to control the locations where conductive layers extend through the conductive pads 506B, and other locations wherein the conductive pad 506A should not be punctured.

Figure 40:
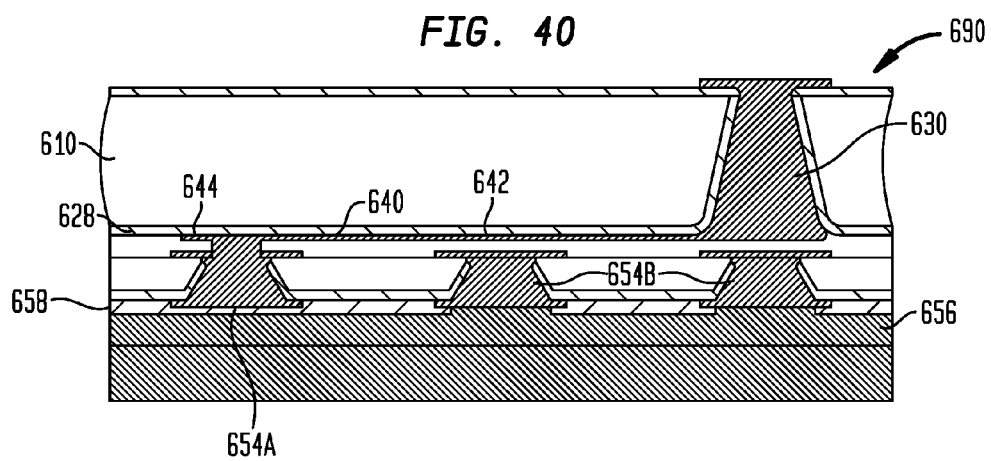
FIG. 40 is a fragmentary sectional view illustrating a microelectronic assembly according to a variation of the embodiment shown in FIG. 39.

FIG. 40 illustrates yet another variation in which an electrically conductive redistribution layer ("RDL") 640 can be formed overlying a surface of a dielectric layer disposed on the packaging layer 610. The RDL can include electrically conductive traces 642 and pads 644. As seen in FIG. 40, traces 642 can electrically connect one or more of the first conductive elements 630 with one or more of the electrically conductive pads 644, which in turn are connected to one or more of the second conductive elements 654A. In a particular embodiment, as illustrated in FIG. 40, some of the second conductive elements 654B may not be electrically connected with a first conductive element of the assembly 690. As further seen in FIG. 40, some of the second conductive elements can be electrically connected to a source of reference potential such as ground through an electrically conductive metal layer 656 in contact therewith. In a particular embodiment, the metal layer 656 can be a joining layer of solder, tin, indium or a combination thereof. In addition, in one embodiment, the metal layer 656 can be used to electrically connect and join one or more of the second conductive elements with a metal ground plane which can also function as a thermally conductive heat spreader for the microelectronic assembly 690. A dielectric layer 658 can electrically insulate a second conductive element 654A from the joining layer 656 of the assembly 690.

Figure 41:
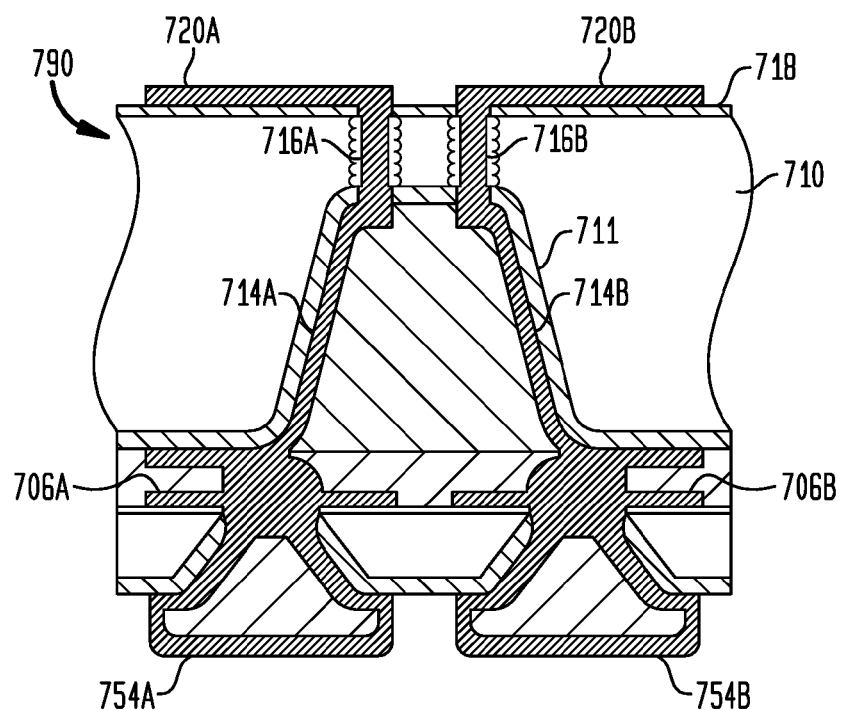
FIG. 41 is a fragmentary sectional view illustrating a microelectronic assembly according to a variation of the embodiment shown in FIG. 21.
Figure 42:
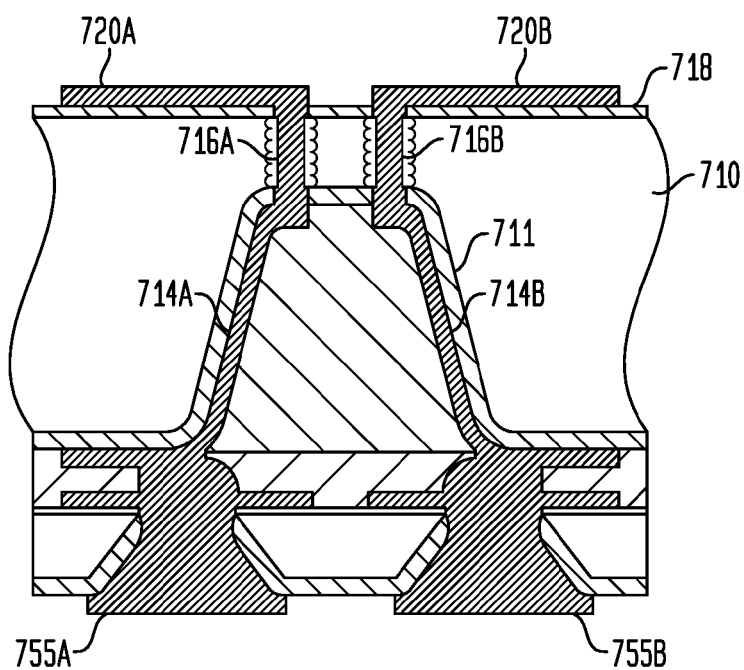
FIG. 42 is a fragmentary sectional view illustrating a microelectronic assembly according to a variation of the embodiment shown in FIG. 41.

Microelectronic assemblies according to other variations of the above-described embodiment (FIGS. 21-32) can be as further seen in FIGS. 41 and 42 in which two or more first conductive elements 714A, 714B extend along interior surfaces of an opening 711 in a packaging layer 710, the first conductive elements including portions 716A, 716B extending through separate openings between the first opening 711 and an exposed surface 718 of a dielectric layer of the assembly 790. The first conductive elements 714A, 714B may include respective electrically conductive pads 720A, 720B exposed at the surface 718 of the dielectric layer 718, which as shown in FIGS. 41 and 42 may overlie the dielectric layer 718. The second conductive elements 754A, 754B of the assembly shown in FIG. 41 vary from the second conductive elements 755A, 755B shown in FIG. 42 in the same way as the second conductive elements in the embodiments described above with respect to FIGS. 17 and 18, specifically, that exposed contact surfaces of the pads 754A, 754B (FIG. 41) overlie a dielectric layer above the respective pads 706A, 706B to which they are connected, whereas in the assembly of FIG. 42, they do not.

Figure 43:
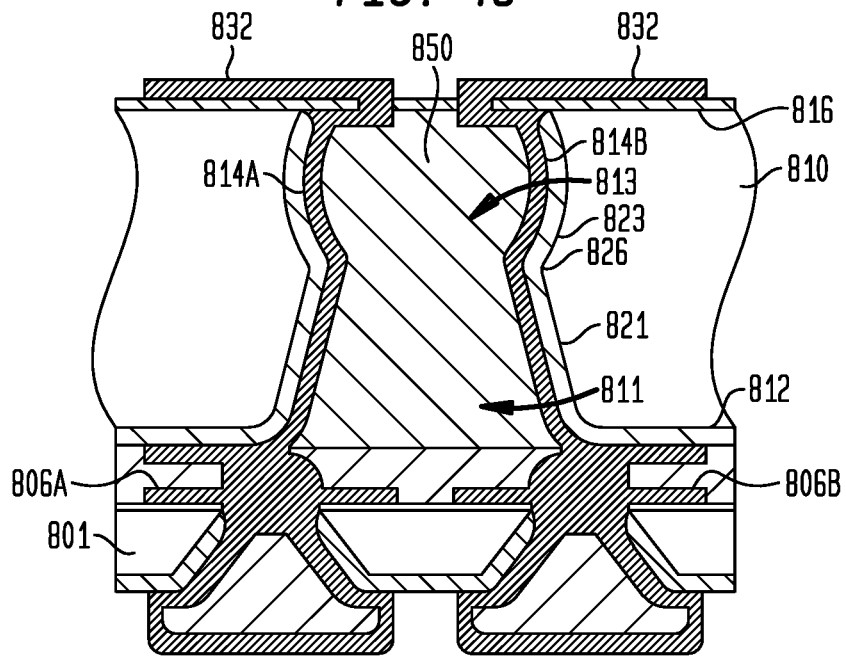
FIG. 43 is a fragmentary sectional view illustrating a microelectronic assembly according to a variation of the embodiment shown in FIG. 42.

FIG. 43 illustrates a further variation in which a plurality of first conductive elements 814A, 814B extend along interior surfaces of a staged opening in the packaging layer 810 from connections to conductive pads 806A, 806B of the wafer and include exposed conductive pads 832 on the packaging layer. In this case, the staged opening includes a first opening 811 extending from a first major surface 812 of the packaging layer 810 adjacent the device wafer 801, and a second opening 813 extending from the first opening 811 at least to a second major surface 816 of the packaging layer 810 remote from the first major surface. The first and second openings can have surfaces 821, 823 which extend in different directions defining a vertex 826 where the surfaces 821, 823 meet. A dielectric material 850 typically covers the first conductive elements 814A, 814B. Interconnection of the first conductive elements 814A, 814B to the conductive pads 806A, 806B can be as described above with reference to FIG. 41.

Figure 44:
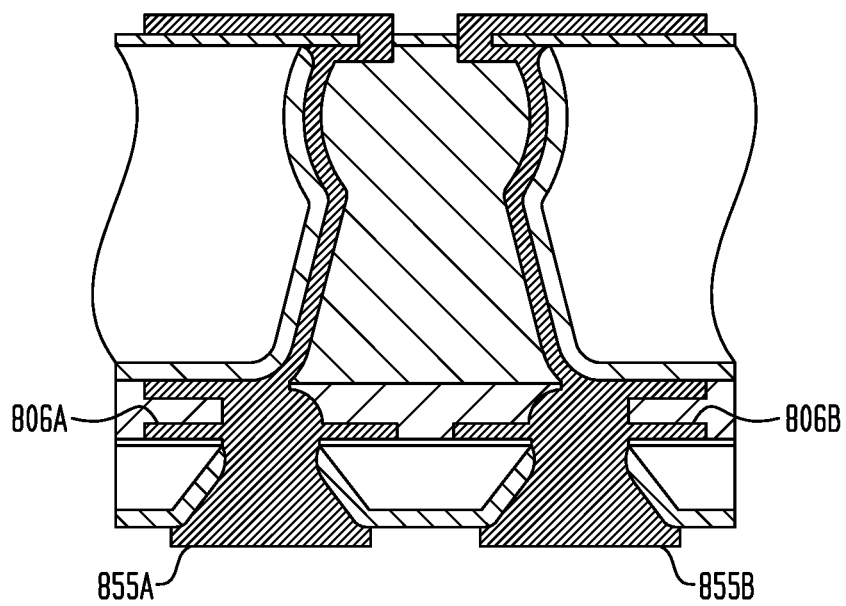
FIG. 44 is a fragmentary sectional view illustrating a microelectronic assembly according to a variation of the embodiment shown in FIG. 43.

FIG. 44 illustrates a variation of the embodiment (FIG. 43) similar to the above-described embodiment (FIG. 42) in which the second conductive elements 855A, 855B have contact surfaces which are not separated from the conductive pads 806A, 806B by a dielectric material.

Figure 45:
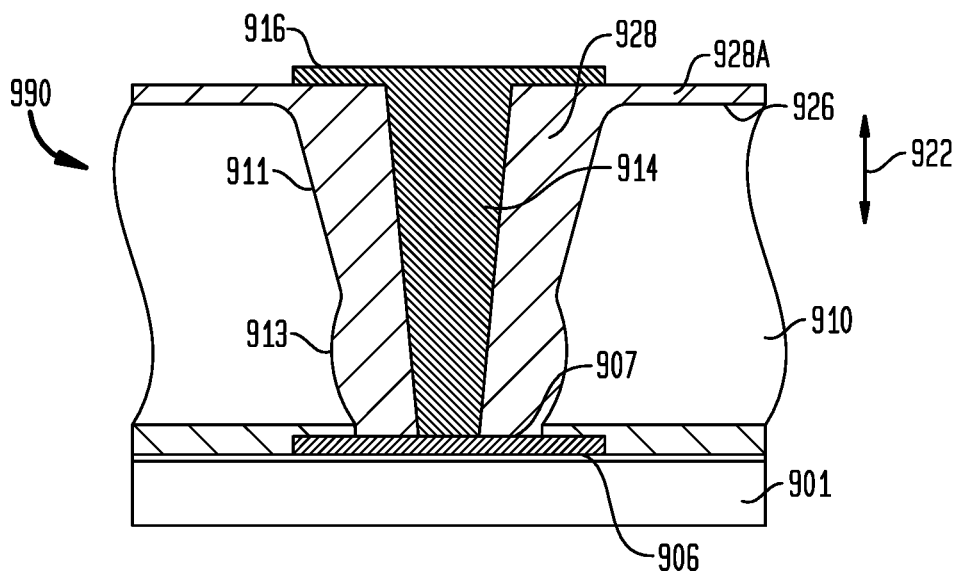
FIG. 45 is a fragmentary sectional view illustrating a microelectronic assembly according to a variation of the embodiment shown in FIG. 2.

FIG. 45 illustrates a microelectronic assembly 990 according to a variation of the embodiment described above with respect to FIG. 2. In this variation, the first electrically conductive elements 914 extending from conductive pads 906 of the device wafer 901 do not conform to contours of interior surfaces of the openings 911, 913, which together extend through the packaging layer 910 in a direction 922 of a thickness of the packaging layer. As seen in FIG. 45, the first conductive elements can have portions which are cylindrical or frustoconical in shape extending in a direction of a thickness of the packaging layer to contact upper surfaces 907 of conductive pads 906.

A dielectric region 928 is provided within the openings 911, 913 which typically contacts upper surfaces 907 of the conductive pads 906, wherein the first conductive elements extend through the dielectric region. A portion 928A of the dielectric region can overlie an outwardly-facing surface 926 of the packaging layer. Electrically conductive pads 916 exposed at a surface of the dielectric region 928 may be provided as portions of the conductive element 914, and can be disposed atop the dielectric region 928. Alternatively, the electrically conductive pads 916 can be omitted.

The microelectronic assembly 990 can be fabricated by processing similar to that described above with reference to FIGS. 6 through 13, except that the dielectric regions 928 are formed by depositing a dielectric material to fill the openings 911, 913. Such dielectric regions 928 typically consist essentially of a polymeric material, which may be compliant, as determined by a combination of the material's modulus of elasticity and the thickness of the dielectric region. After forming the dielectric regions, apertures can be formed extending through the dielectric regions 928 to expose at least portions of the conductive pads 906. The apertures can have at least one of cylindrical or frustoconical shape, among others. An electrically conductive layer or filling, e.g., a metal or conductive compound of a metal, can then be provided in the apertures to form vertically extending portions of the first conductive elements 914. Thereafter, exposed conductive pad portions 916 can then be formed above a surface of the dielectric layer 928.

Figure 46:
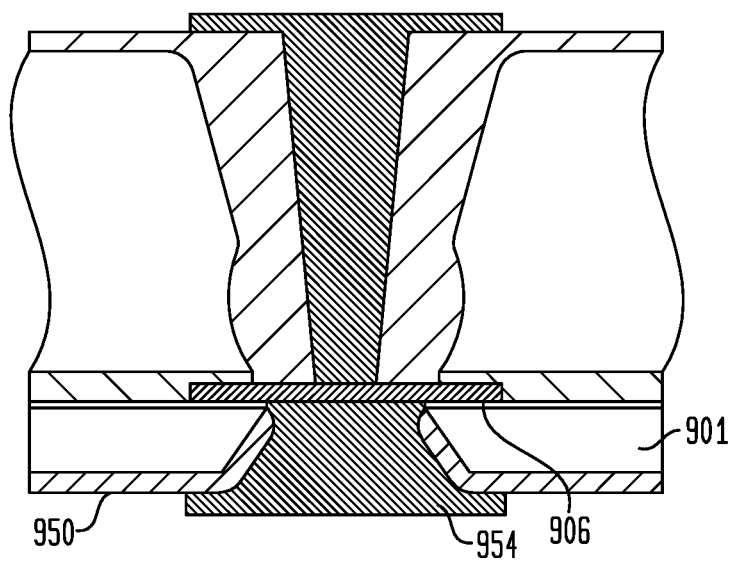
FIG. 46 is a fragmentary sectional view illustrating a microelectronic assembly according to a variation of the embodiments shown in FIG. 45 and FIG. 3.

FIG. 46 illustrates a variation of the embodiment shown in FIG. 45 in which second electrically conductive elements 954, similar to the second conductive element 164 described above relative to FIG. 4, are exposed at an exposed surface of the device wafer 901 and electrically contact the conductive pads 906.

Figure 47:
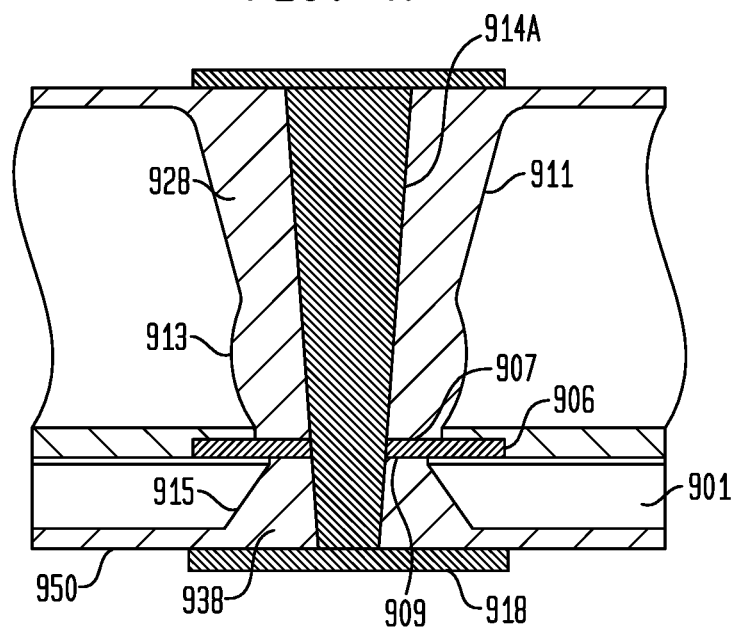
FIG. 47 is a fragmentary sectional view illustrating a microelectronic assembly according to a variation of the embodiments shown in FIG. 46.

FIG. 47 illustrates a variation of the embodiment shown in FIG. 46 in which second dielectric regions 938 overlie lower surfaces 909 of the conductive pads 906 which are opposite the upper surfaces 907. In this case, vertically extending cylindrical or frustoconical portions 914A of the first conductive elements may extend through the conductive pads 906 to electrically conductive pad portions 918 exposed at the outwardly-facing rear surface 950 of the device wafer 901. In this case, the vertically extending portions 914A may not conform to contours of interior surfaces of any of the openings 911, 913 and 915 in the packaging layer and the device wafer, respectively. Fabrication of the microelectronic assembly (FIG. 47) varies in that the dielectric regions 928, 938 are formed in the openings 911, 911, 915, after which cylindrical or frustoconical openings are formed extending through the conductive pads 906 and the dielectric regions 928, 938, such as by laser ablation, micro-abrasive particle stream (e.g., "sandblasting"), or other technique. Thereafter, in one embodiment, conductive pads 916, 918 can be formed which can be exposed at opposite faces of the microelectronic assembly.

Figure 48:
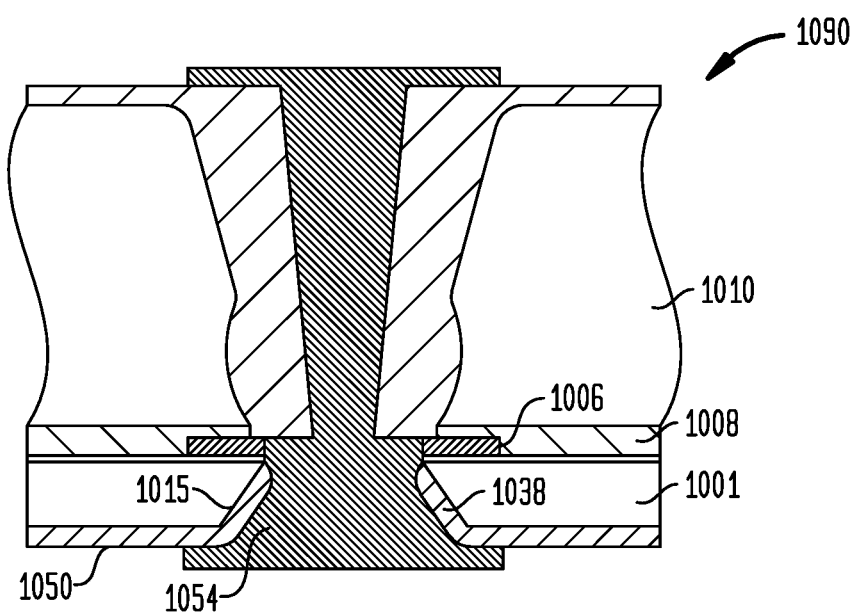
FIG. 48 is a fragmentary sectional view illustrating a microelectronic assembly according to a variation of the embodiments shown in FIG. 47.

FIG. 48 illustrates a microelectronic assembly 1090 according to a variation of the embodiment shown in FIG. 47 in which second conductive elements 1054 can extend through thicknesses of the conductive pads 1006. In one embodiment, the fabrication of the microelectronic assembly 1090 can include forming openings 1015 in the device wafer 1001 which includes patterning the conductive pads 1006, e.g., by etching, laser ablation, micro-abrasive particle streaming, etc. in a direction from a lower surface 1050 of the device wafer 1001. Such patterning can be limited by the presence of the bonding layer 1008 between the device wafer and packaging layer 1010. After forming dielectric layers 1038 in the openings 1015, The second conductive elements 1054 then can be formed extending within the openings 1015.

Figure 49:
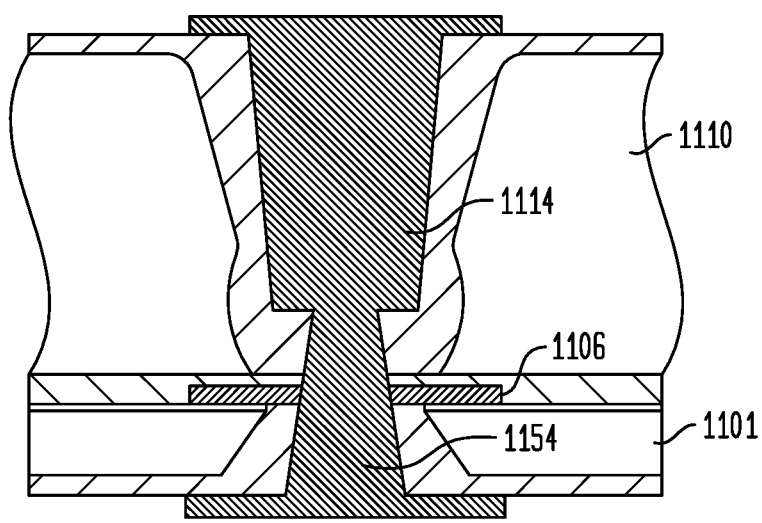
FIG. 49 is a fragmentary sectional view illustrating a microelectronic assembly according to a variation of the embodiments shown in FIG. 48.

FIG. 49 illustrates a further variation in which the first and second electrically conductive elements 1114, 1154 meet at locations within the thickness of the packaging layer 1110. In this case, the second conductive elements 1154 extend through the electrically conductive pads 1106 of the device wafer 1101.

Figure 50:
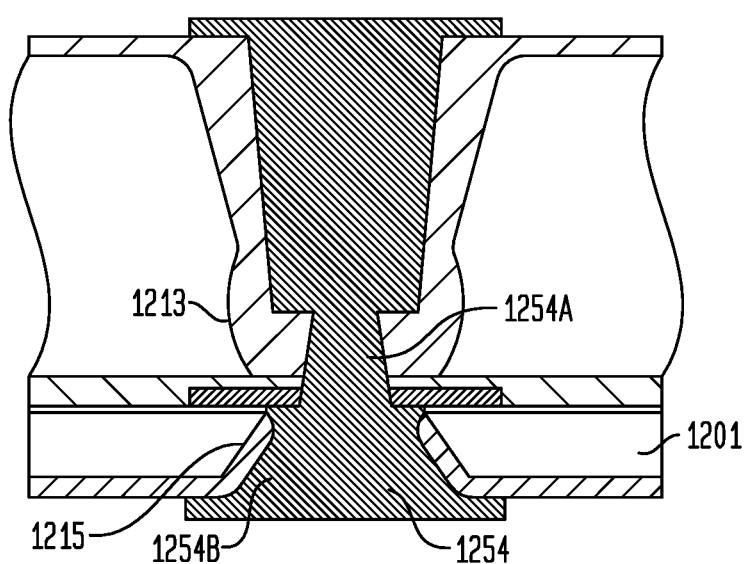
FIG. 50 is a fragmentary sectional view illustrating a microelectronic assembly according to a variation of the embodiments shown in FIG. 49.

As further seen in FIG. 50, in a variation of the embodiment (FIG. 49), the second conductive elements 1254 may include portions 1254B which conform to contours of interior surfaces of the openings 1215 in the device wafer 1201. However, as seen in FIG. 50, portions 1254A which extend within the thickness of the packaging layer 1210 may not conform to contours of interior surfaces of the openings 1213 into which portions 1254A extend.

Figure 51:
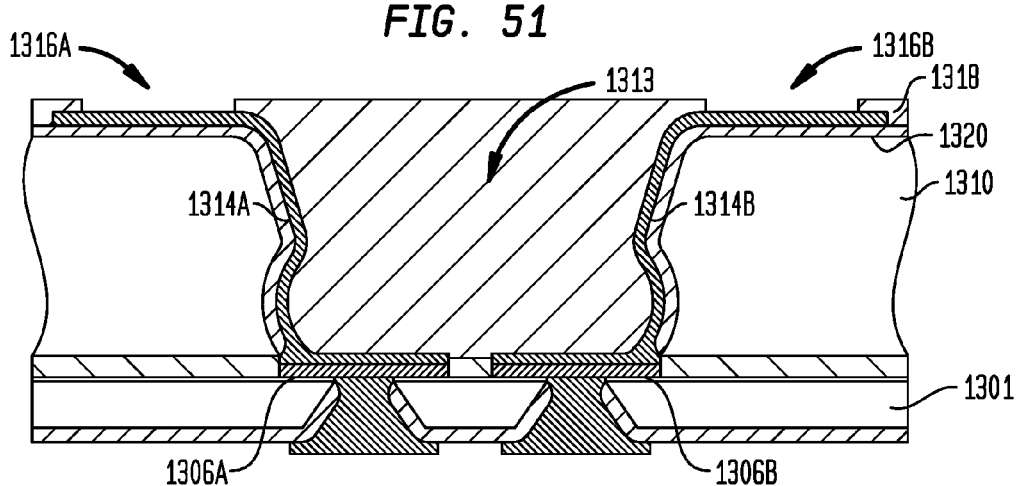
FIG. 51 is a fragmentary sectional view illustrating a microelectronic assembly according to a variation of the embodiments shown in FIG. 18.

FIG. 51 illustrates a microelectronic assembly according to a variation of the embodiment described above (FIG. 43) in which first and second conductive pads 1306A, 1306B of a microelectronic element 1301 are at least substantially exposed within a relatively wide through opening 1313 in the first element 1310. Separate conductive elements 1314A, 1314B to the pads extend along interior surfaces of the opening and can be exposed within openings 1316A, 1316B in a dielectric layer 1318 which overlies a major surface 1320 of the first element.

Figure 52:
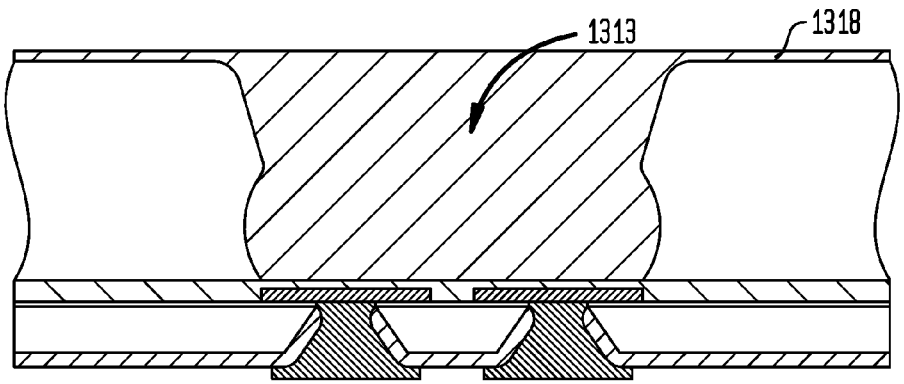
FIGS. 52 and 53 are fragmentary sectional views illustrating a microelectronic assembly according to a variation of the embodiments shown in FIG. 46.
Figure 53:
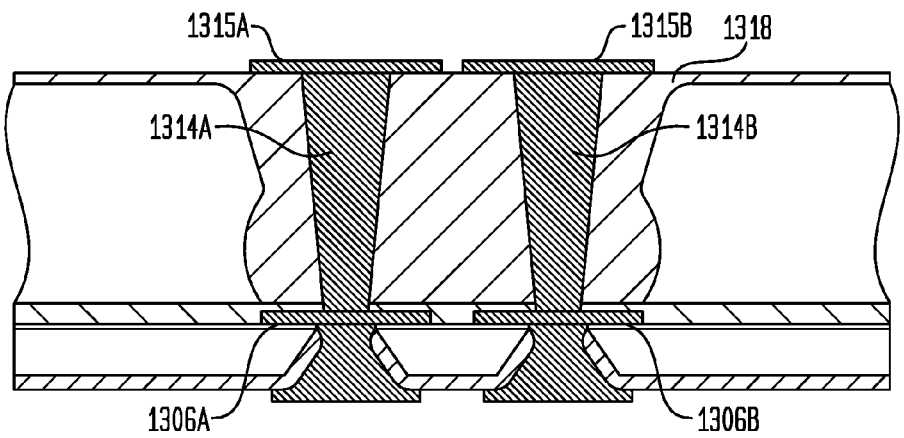

FIG. 52 illustrates a stage in a method of conductive elements in yet another variation of the above-described embodiment (FIG. 51). In this case, opening 1313 is formed extending through a thickness of the first element and then is filled with a dielectric material 1318, such as by one of the techniques described above. Then, as seen in FIG. 53, conductive elements 1314 similar to those described above (FIG. 45) can be formed extending through the dielectric region 1318 to contact the conductive pads 1306A, 1306B. Optionally, electrically conductive pads 1315A, 1315B can be provided atop the conductive elements 1314A, 1314B, these typically being exposed for interconnection with an external component.

Figure 54:
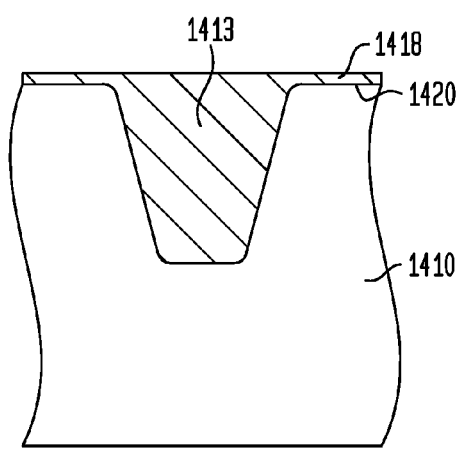
FIGS. 54, 55, 56, 57, 58, 59, 60, 61, and 62 are fragmentary sectional views illustrating stages in a method of fabricating a microelectronic assembly shown in FIG. 45, according to an embodiment of the invention.
Figure 55:
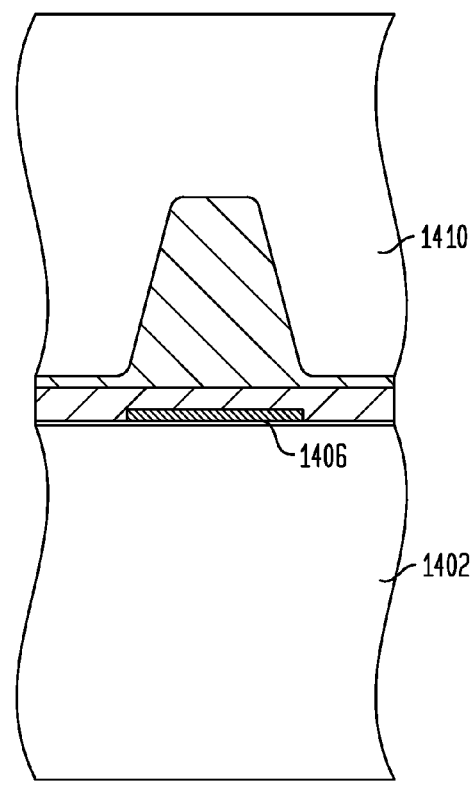

Turning now to FIG. 54 et seq., a method will now be described for fabricating a microelectronic assembly according to a variation of the above-described embodiment (FIGS. 22-34). As seen in FIG. 54, an opening 1413 is formed extending from a major surface of a first element 1410 (e.g., an element having a CTE of less than 10 ppm/° C.). In one example, the first element may consist essentially of semiconductor or dielectric material. The first element 1410 then is filled with a dielectric material 1418, which can form a layer overlying a major surface 1420 of the first element. Referring to FIG. 55, the first element 1410 then is assembled, e.g., bonded with a microelectronic element 1402 having electrically conductive pads 1406 thereon, one of which is illustrated in FIG. 55.

Figure 56:
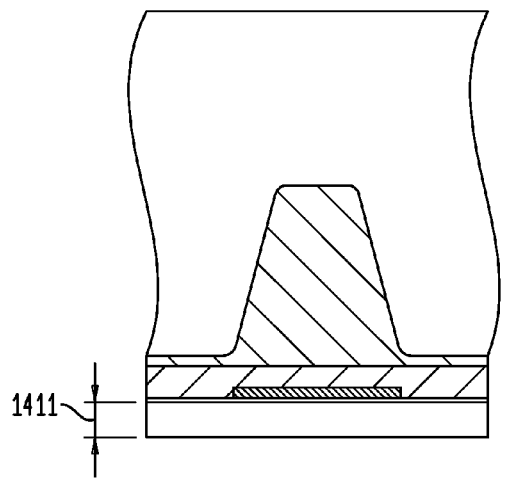
Figure 57:
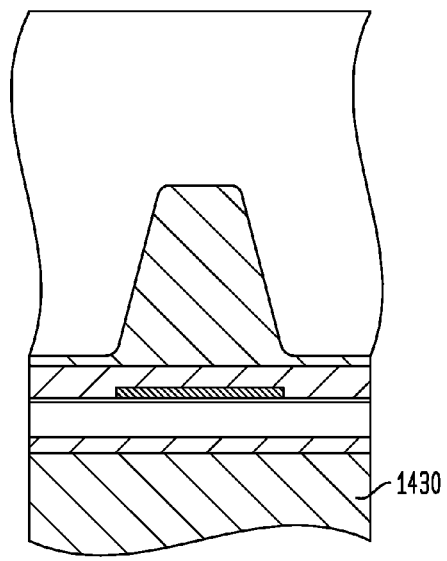
Figure 58:
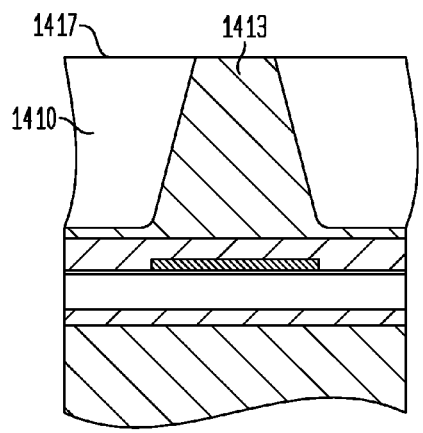

Then, in like manner as described above (FIG. 26), a reduced thickness 1411 of the microelectronic element can be achieved by grinding, lapping or polishing, or combination thereof, as described above, as seen in FIG. 56. Then, the structure can be assembled with a carrier 1430 (FIG. 57), and a thickness of the first element 1410 above the opening 1413 can be reduced until the opening is exposed at a surface 1417 of the first element (FIG. 58).

Figure 59:
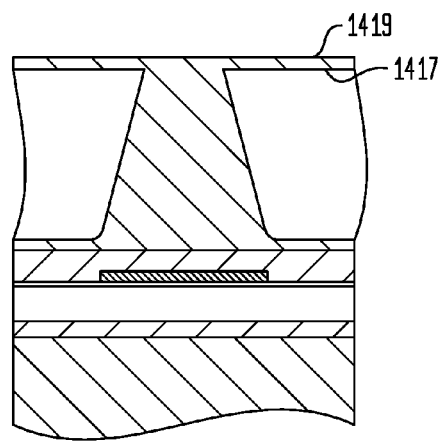
Figure 60:
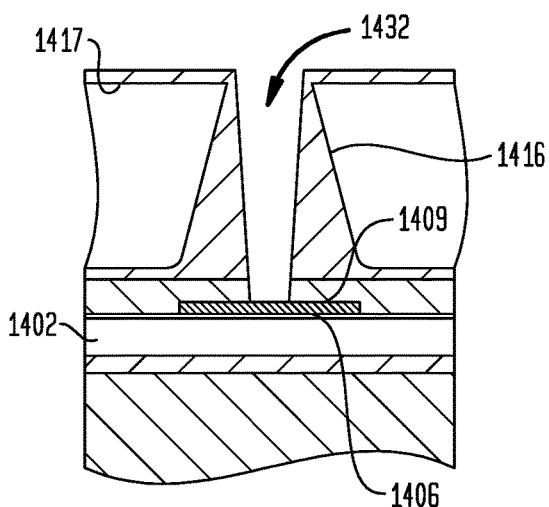

A dielectric layer 1419 may then be formed atop the surface 1417, as seen in FIG. 59. Thereafter, an opening 1432 can be formed which extends through the dielectric material both above the surface 1417 (FIG. 60) and within the opening 1416 to expose a portion of the conductive pad 1406. Typically, a portion of the upper surface 1409 (i.e., the surface facing away from microelectronic element 1402) is exposed within opening 1432. However, in some cases, the opening 1432 can extend through the pad 1406 such that interior surfaces of an opening in the pad 1406 can be exposed.

Figure 61:
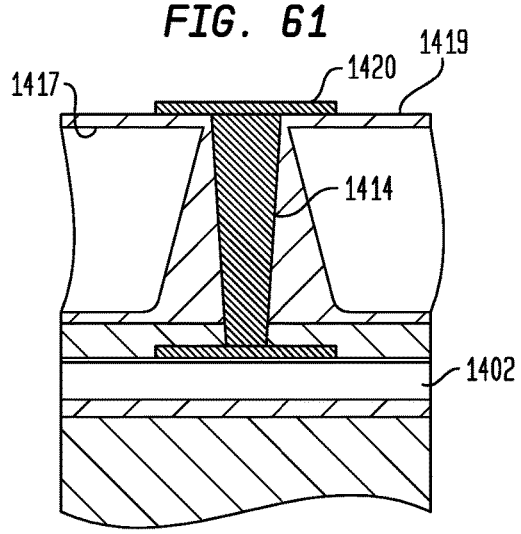

FIG. 61 illustrates a subsequent stage in which a metal has been deposited in one or more steps to form an electrically conductive element 1414 and an electrically conductive pad 1420 overlying the conductive element 1414. The pad 1420 may or may not overlie a surface of the first element 1417 and dielectric layer 1419. FIG. 61 illustrates an example in which the conductive element is non-hollow, i.e., filled throughout with a metal. After reaching the stage shown in FIG. 61, the carrier can be removed from the microelectronic element 1402, resulting in a structure as seen in FIG. 62.

Figure 62:
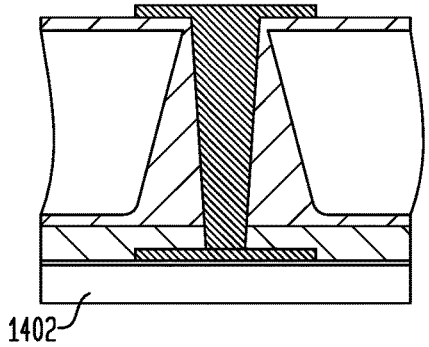
Figure 63:
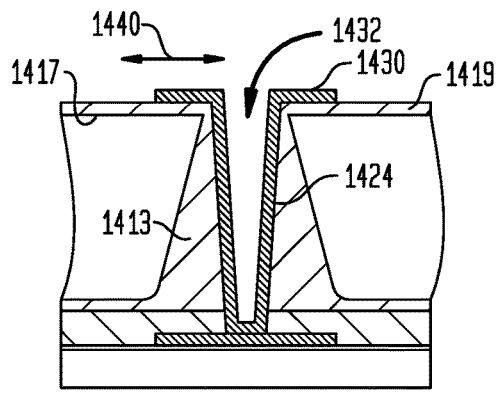
FIG. 63 is a fragmentary sectional view illustrating a microelectronic assembly according to a variation of the embodiments shown in FIG. 62.

FIG. 63 illustrates a further variation of the embodiment seen in FIG. 62 in which the conductive element 1424 can be a hollow structure, such as formed by depositing a metal to line an interior surface of the opening 1432. The conductive element in either the FIG. 62 or FIG. 63 variation will typically be in form of an annular structure which conforms to a contour of the opening 1432 in the dielectric material, but which does not conform to the opening 1413 that was first made in the first element 1410. A conductive pad 1430 can overlie the conductive element 1424 and can extend in one or more lateral directions 1440 away therefrom, lateral being a direction in which the surface 1417 of the first element extends.

Figure 64:
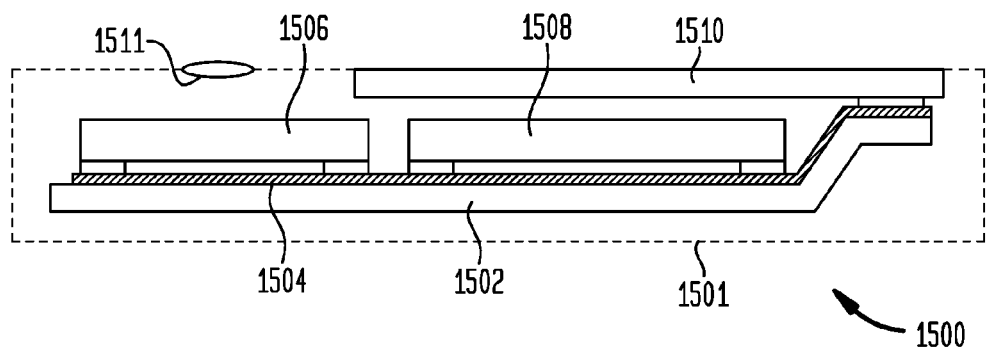
FIG. 64 is a schematic depiction of a system according to one embodiment of the invention.

The structure and fabrication of the microelectronic assemblies and incorporation thereof into higher-level assemblies can include structure, and fabrication steps which are described in one or more of the following commonly owned co-pending United States applications each filed on Dec. 2, 2010: U.S. Provisional Application No. 61/419,037; and U.S. Nonprovisional application Ser. No. 12/958,866; and the following U.S. applications each filed Jul. 23, 2010: application Ser. Nos. 12/842,717; 12/842,651; 12/842,612; 12/842,669; 12/842,692; and 12/842,587; the disclosures of all such applications being incorporated by reference herein. The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 1500 in accordance with a further embodiment of the invention includes a structure 1506 as described above in conjunction with other electronic components 1508 and 1510. In the example depicted, component 1508 is a semiconductor chip whereas component 1510 is a display screen, but any other components can be used. Of course, although only two additional components are depicted in FIG. 64 for clarity of illustration, the system may include any number of such components. The structure 1506 as described above may be, for example, a microelectronic assembly 100 as discussed above in connection with FIG. 1, or any of FIGS. 2-63. In a further variant, both may be provided, and any number of such structures may be used. Structure 1506 and components 1508 and 1510 are mounted in a common housing 1501, schematically depicted in broken lines, and are electrically interconnected with one another as necessary to form the desired circuit. In the exemplary system shown, the system includes a circuit panel 1502 such as a flexible printed circuit board, and the circuit panel includes numerous conductors 1504, of which only one is depicted in FIG. 64, interconnecting the components with one another. However, this is merely exemplary; any suitable structure for making electrical connections can be used. The housing 1501 is depicted as a portable housing of the type usable, for example, in a cellular telephone or personal digital assistant, and screen 1510 is exposed at the surface of the housing. Where structure 1506 includes a light-sensitive element such as an imaging chip, a lens 1511 or other optical device also may be provided for routing light to the structure. Again, the simplified system shown in FIG. 64 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A microelectronic assembly, comprising:
   a first element consisting essentially of at least one of semiconductor or inorganic dielectric material;
   a microelectronic element attached to the first element such that a surface of the first element faces a major surface of the microelectronic element, the microelectronic element having a plurality of conductive pads exposed at the major surface and each having an upper surface facing toward the first element, the microelectronic element having active semiconductor devices therein;
   a first opening extending from an exposed surface of the first element towards the surface thereof which faces the microelectronic element, and a second opening extending from the first opening to a first one of the conductive pads, wherein where the first and second openings meet, interior surfaces of the first and second openings extend at different angles relative to the major surface of the microelectronic element; and
   a conductive element extending within the first and second openings and contacting the first one of the conductive pads, wherein the conductive element is directly bonded to the upper surface of the first one of the conductive pads.

2. A method of forming a microelectronic assembly, comprising:
   (a) attaching a first element consisting essentially of at least one of semiconductor or inorganic dielectric material with a microelectronic element such that a first surface of the first element faces a major surface of the microelectronic element, the microelectronic element having at least one electrically conductive pad having an upper surface exposed at the major surface, the microelectronic element having active semiconductor devices adjacent the major surface;
   (b) then forming a first conductive element extending through the first element, wherein the forming of the first conductive element includes directly bonding the first conductive element to the upper surface of the at least one conductive pad; and
   (c) before or after step (b), forming a second conductive element extending through the microelectronic element, wherein the forming of the second conductive element includes directly bonding the second conductive element to the at least one conductive pad or a second conductive pad at the major surface.

3. The method as claimed in claim 2, wherein the direct bonding of the first conductive element to the at least one conductive pad is performed without the use of solder.

4. The method as claimed in claim 2, wherein the direct bonding of the second conductive element to the at least one conductive pad or the second conductive pad is performed without the use of solder.

5. The method as claimed in claim 2, wherein the first and second conductive elements are exposed at opposite faces of the microelectronic assembly.

6. The method as claimed in claim 2, wherein the microelectronic element includes a plurality of chips attached together at dicing lines, the method further comprising severing the microelectronic assembly along the dicing lanes into individual units, each unit including at least one of the plurality of chips.

7. The method as claimed in claim 6, wherein the first element is a carrier which does not have active semiconductor devices therein.

8. The method as claimed in claim 7, wherein the first element further includes at least one passive device therein.

9. The method as claimed in claim 7, wherein the carrier mechanically supports the microelectronic element.

10. The method as claimed in claim 2, wherein the step of forming the first conductive element includes forming an opening extending through the thickness of the first element after the step of attaching, and then depositing a metal layer at least within the opening in the first element, the metal layer contacting the upper surface of the at least one conductive pad exposed within the opening.

11. The method as claimed in claim 2, wherein the step of forming the second conductive element includes forming an opening extending through the thickness of the microelectronic element after the step of attaching, and then depositing a metal layer at least within the opening, the metal layer contacting the lower surface of the at least one conductive pad exposed within the opening in the microelectronic element.

12. A method of forming a microelectronic assembly, comprising:
   (a) attaching a first element consisting essentially of at least one of semiconductor or inorganic dielectric material with a microelectronic element such that a first surface of the first element faces a major surface of the microelectronic element, the microelectronic element having at least one electrically conductive pad having an upper surface exposed at the major surface, the microelectronic element having active semiconductor devices adjacent the major surface, wherein the first surface and the major surface each are defined by a dielectric material, and the attaching includes directly bonding the dielectric material of the first surface to the dielectric material of the major surface;
   (b) then forming a first conductive element extending through the first element and contacting the upper surface of the at least one conductive pad; and
   (c) before or after step (b), forming a second conductive element extending through the microelectronic element, the second conductive element contacting the at least one conductive pad or a second conductive pad at the major surface.

13. The method as claimed in claim 12, wherein the forming of the first conductive element includes directly bonding the first conductive element to the upper surface of the at least one conductive pad, and the forming of the second conductive element includes directly bonding the second conductive element to the at least one conductive pad or the second conductive pad at the major surface.

14. The method as claimed in claim 13, wherein the direct bonding of the first conductive element to the at least one conductive pad is performed without the use of solder.

15. The method as claimed in claim 13, wherein the direct bonding of the second conductive element to the at least one conductive pad or the second conductive pad is performed without the use of solder.

16. The microelectronic assembly as claimed in claim 1, wherein the conductive element is directly bonded to the upper surface of the first one of the conductive pads without the use of solder.

17. The microelectronic assembly as claimed in claim 1, wherein the first surface and the major surface each are defined by a dielectric material, and the dielectric material of the first surface is directly bonded to the dielectric material of the major surface.

18. The microelectronic assembly as claimed in claim 1, wherein the conductive element has at least one of cylindrical or frusto-conical shape.

19. The microelectronic assembly as claimed in claim 18, wherein a first portion of the conductive element tapers uniformly from a first width adjacent the exposed surface of the first element to a second width at a first location within the second opening, and a second portion of the conductive element tapers uniformly from a third width adjacent the rear surface of the microelectronic element to a fourth width at the first location.

20. The microelectronic assembly as claimed in claim 1, wherein the conductive element has a shape determined independently from a contour of an interior surface of at least one of the first and second openings.

* * * * *